United States Patent
Lee et al.

(10) Patent No.: US 11,910,703 B2
(45) Date of Patent: Feb. 20, 2024

(54) QUANTUM DOT COMPOSITION INCLUDING A QUANTUM DOT, AND A LIGAND HAVING A HEAD PORTION, A CONNECTING PORTION INCLUDING A METAL, AND A TAIL PORTION

(71) Applicant: Samsung Display Co., Ltd., Yongin-si (KR)

(72) Inventors: Changhee Lee, Seoul (KR); Yunku Jung, Cheonan-si (KR); Hyojin Ko, Seoul (KR); Dukki Kim, Suwon-si (KR); Sehun Kim, Yongin-si (KR); Jaehoon Kim, Seoul (KR); Hyunmi Doh, Seoul (KR); Jaekook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 435 days.

(21) Appl. No.: 17/152,640

(22) Filed: Jan. 19, 2021

(65) Prior Publication Data

US 2021/0376242 A1    Dec. 2, 2021

(30) Foreign Application Priority Data

Jun. 2, 2020    (KR) .................. 10-2020-0066535

(51) Int. Cl.
*H01L 51/00* (2006.01)
*H10K 85/30* (2023.01)
(Continued)

(52) U.S. Cl.
CPC ............ *H10K 85/361* (2023.02); *C09K 11/06* (2013.01); *H10K 85/381* (2023.02);
(Continued)

(58) Field of Classification Search
CPC .. H10K 85/361; H10K 85/381; H10K 50/115; H10K 71/00; H10K 59/38;
(Continued)

(56) References Cited

U.S. PATENT DOCUMENTS

| 7,374,807 B2 * | 5/2008 | Parce ...................... C09D 7/61 |
| | | 428/68 |
| 10,717,927 B2 | 7/2020 | Kim et al. |

(Continued)

FOREIGN PATENT DOCUMENTS

| CA | 2344479 C * | 3/2010 | ............. B82Y 15/00 |
| JP | 2013136754 A * | 7/2013 | ............. B82Y 20/00 |

(Continued)

OTHER PUBLICATIONS

Jin, Ho et al., "SnS44-, SbS43-, and AsS33- Metal Chalcogenide Surface Ligands Couplings to Quantum Dots, Electron Transfers, and All-Inorganic Multilayered Quantum Dot Sensitized Solar Cells", J. Am. Chem. Soc., Nov. 2015, vol. 137, Issue 43, pp. 13827-13835 (9 pages); DOI: 10.1021/jacs.5b05787.

(Continued)

*Primary Examiner* — Ermias T Woldegeorgis
(74) *Attorney, Agent, or Firm* — Lewis Roca Rothgerber Christie LLP

(57) ABSTRACT

A quantum dot composition includes a quantum dot, and a ligand bonded to a surface of the quantum dot, wherein the ligand includes a head portion bonded to the surface of the quantum dot, a connecting portion connected to the head portion and including a metal, and a tail portion coordinated to the metal of the connecting portion. The quantum dot composition according to the present embodiments is used to form an emission layer of a light emitting element, and may thus increase service life and luminous efficiency of the (Continued)

light emitting element including the emission layer formed using the quantum dot composition.

20 Claims, 15 Drawing Sheets

(51) Int. Cl.
*C09K 11/06* (2006.01)
*H10K 50/115* (2023.01)
*H10K 71/00* (2023.01)

(52) U.S. Cl.
CPC .... *C09K 2211/10* (2013.01); *C09K 2211/188* (2013.01); *H10K 50/115* (2023.02); *H10K 71/00* (2023.02)

(58) Field of Classification Search
CPC .... H10K 50/11; C09K 11/06; C09K 2211/10; C09K 2211/188; C09K 11/02; C09K 11/025; C09K 2211/18
See application file for complete search history.

(56) References Cited

U.S. PATENT DOCUMENTS

| | | | | |
|---|---|---|---|---|
| 2004/0178390 | A1* | 9/2004 | Whiteford | G01N 33/588 252/500 |
| 2007/0034833 | A1* | 2/2007 | Parce | C01B 19/007 252/301.36 |
| 2019/0136126 | A1 | 5/2019 | Yang et al. | |
| 2020/0172802 | A1 | 6/2020 | Ahn et al. | |
| 2021/0371732 | A1 | 12/2021 | Lee et al. | |
| 2021/0371736 | A1 | 12/2021 | Lee et al. | |
| 2021/0371737 | A1 | 12/2021 | Jung et al. | |
| 2021/0371738 | A1 | 12/2021 | Lee et al. | |
| 2021/0371739 | A1 | 12/2021 | Lee et al. | |
| 2021/0376242 | A1 | 12/2021 | Lee et al. | |

FOREIGN PATENT DOCUMENTS

| | | | |
|---|---|---|---|
| KR | 20090038022 A | * | 4/2009 |
| KR | 10-1361861 B1 | | 2/2014 |
| KR | 10-1740429 B1 | | 5/2017 |
| KR | 10-2018-0008262 A | | 1/2018 |
| KR | 10-1835110 B1 | | 3/2018 |
| KR | 10-2018-0059363 A | | 6/2018 |
| KR | 10-2018-0105500 A | | 9/2018 |
| KR | 10-2019-0050726 A | | 5/2019 |
| KR | 1020210149950 A | | 12/2021 |
| KR | 1020210149956 A | | 12/2021 |
| KR | 1020210149968 A | | 12/2021 |
| KR | 1020210149971 A | | 12/2021 |
| KR | 1020210149974 A | | 12/2021 |
| KR | 1020210149975 A | | 12/2021 |

OTHER PUBLICATIONS

Kovalenko, Maksym V. et al., "Expanding the Chemical Versatility of Colloidal Nanocrystals Capped with Molecular Metal Chalcogenide Ligands", J. Am. Chem. Soc., Jul. 2010, vol. 132, Issue 29, pp. 10085-10092 (8 pages).

Brown, Patrick R. et al., "Energy Level Modification in Lead Sulfide Quantum Dot Thin Films through Ligand Exchange," ACS Nano, vol. 8, No. 6, 2014, pp. 5863-5872.

Chuang, Chia-Hao M. et al., "Improved performance and stability in quantum dot solar cells through band alignment engineering," Nature Materials, Letters, vol. 13, Issue 8, Aug. 2014, pp. 796-801.

* cited by examiner

QUANTUM DOT COMPOSITION INCLUDING A QUANTUM DOT, AND A LIGAND HAVING A HEAD PORTION, A CONNECTING PORTION INCLUDING A METAL, AND A TAIL PORTION

CROSS-REFERENCE TO RELATED APPLICATIONS

This application claims priority to and the benefit of Korean Patent Application No. 10-2020-0066535, filed on Jun. 2, 2020, the entire content of which is hereby incorporated by reference.

BACKGROUND

One or more aspects of embodiments of the present disclosure herein relates to a quantum dot composition, a light emitting element including an emission layer formed from (utilizing) the quantum dot composition, and a method for manufacturing the same.

Various display devices used for multimedia devices such as a television set, a mobile phone, a tablet computer, a navigation system, and/or a game console are being developed. In such display devices, a self-luminescent display element is used, which accomplishes display by causing (or facilitating) an organic compound-containing light emitting material to emit light.

In addition, development of a light emitting element using quantum dots as a light emitting material is underway, as an effort to enhance the color reproducibility of display devices, and there is a demand for increasing the luminous efficiency and service life of a light emitting element using quantum dots.

SUMMARY

One or more aspects of embodiments of the present disclosure are directed toward a quantum dot composition which can be used in an emission layer of a light emitting element to exhibit improved luminous efficiency.

One or more aspects of embodiments of the present disclosure are also directed toward a light emitting element that exhibits improved luminous efficiency by including, in an emission layer, a quantum dot having a surface to which a modified ligand material is bonded.

Embodiments of the present disclosure further provide a method for manufacturing a light emitting element including a quantum dot having a surface to which a modified ligand material is bonded.

One or more embodiments of the present disclosure provide a quantum dot composition including a quantum dot, and a ligand bonded to a surface of the quantum dot, wherein the ligand includes a head portion bonded to the surface of the quantum dot, a connecting portion connected to the head portion and including a metal, and a tail portion coordinated to the metal of the connecting portion.

The head portion may include at least one selected from a thiol group and a hydroxyl group.

The quantum dot may include a core and a shell around the core.

The quantum dot composition may further include a ligand-removal agent to react with the connecting portion.

The connecting portion may include at least one among (e.g., at least one selected from) Cd, Zn, In, Sn, Sb, Ga, Ge, As, Hg, Ni, Pd, Pt, Co, Rh, Ir, Fe, Ru, Os, Mn, Mo, and Cr.

The tail portion may include at least one among (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide connecting atom (S, Se, Te (i.e., at least one selected from S, Se, and Te)), an oxygen atom, and a nitrogen atom. In the tail portion, R may be an alkyl group having 1 to 20 carbon atoms.

The ligand may be a monodentate ligand or a bidentate ligand.

The ligand may be represented by Formula 1 below:

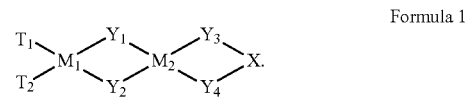

Formula 1

In Formula 1, $T_1$ and $T_2$ may each independently be a thiol group or a hydroxyl group, $M_1$ and $M_2$ may each independently be at least one selected from Cd, Zn, In, Sn, Sb, Ga, Ge, As, Hg, Ni, Pd, Pt, Co, Rh, Ir, Fe, Ru, Os, Mn, Mo, and Cr, $Y_1$ to $Y_4$ may each independently be O or S, and X may be a substituted or unsubstituted amine group, a substituted or unsubstituted oxy group, a substituted or unsubstituted thio group, a substituted or unsubstituted ester group, a substituted or unsubstituted amide group, or a substituted or unsubstituted alkyl group having 1 to 20 carbon atoms.

The quantum dot composition may further include an organic solvent.

In some embodiments of the present disclosure, a light emitting element includes a first electrode, a hole transport region on the first electrode, an emission layer on the hole transport region and containing a quantum dot having a hydrophilic group, an electron transport region on the emission layer, and a second electrode on the electron transport region.

The quantum dot may include a core and a shell around (e.g., surrounding) the core, and the hydrophilic group may be bonded to a surface of the quantum dot.

The hydrophilic group may include at least one selected from a thiol group and a hydroxyl group.

The emission layer may further include ligand residue containing a metal and an organic ligand.

The ligand residues may include at least one among (e.g., at least one selected from) Cd, Zn, In, Sn, Sb, Ga, Ge, As, Hg, Ni, Pd, Pt, Co, Rh, Ir, Fe, Ru, Os, Mn, Mo, and Cr.

The ligand residues may include at least one among (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide connecting atom (S, Se, Te), an oxygen atom, and a nitrogen atom. In the ligand residues, R may be an alkyl group having 1 to 20 carbon atoms.

At least a part of the organic ligand may be coordinated to the metal.

In some embodiments of the present disclosure, a method for manufacturing a light emitting element includes forming a first electrode; forming a hole transport region on the first electrode; forming an emission layer by providing, on the hole transport region, a quantum dot composition containing a quantum dot composite having a quantum dot and a ligand bonded to a surface of the quantum dot; forming an electron transport region on the emission layer; and forming a second electrode on the electron transport region, wherein the ligand includes a head portion bonded to the surface of the quantum dot, a connecting portion connected to the head portion and containing a metal, and a tail portion coordinated to the metal of the connecting portion.

The forming of the emission layer may include providing the quantum dot composition to form a preliminary emission layer, and applying heat or light to the preliminary emission layer so as to dissociate at least a part of the ligand bonded to the quantum dot.

The emission layer may include a quantum dot containing a hydrophilic group, and in the hydrophilic group-containing quantum dot, a remaining part of the ligand, except for the part of the ligand dissociated from the quantum dot, may be bonded to the quantum dot surface.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
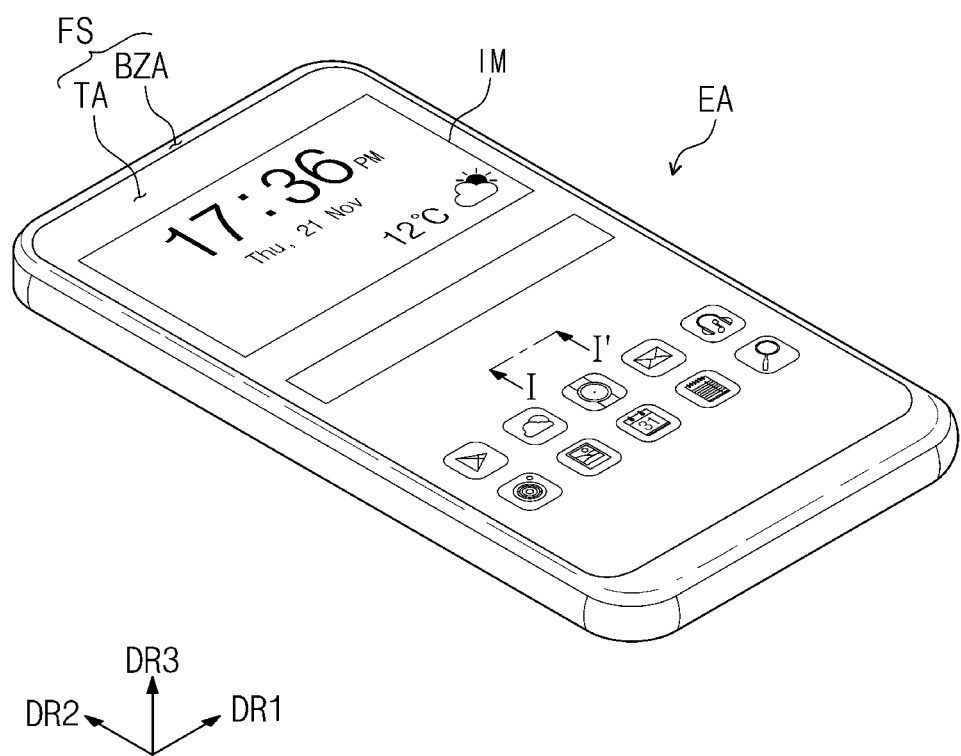
FIG. 1 is a perspective view of an electronic device of an embodiment.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, it means that the element may be directly on/connected to/coupled to the other element, or that a third element may be positioned therebetween.

In the present disclosure, "directly on" means that there is no layer, film, region, plate and/or the like added between a portion of a layer, a film, a region, a plate and/or the like and other portions. For example, "directly on" may mean positioning two layers or two members adjacent to each other, without additional members such as an adhesive member between them.

Like reference numerals refer to like elements. Also, in the drawings, the thickness, the ratio, and the dimensions of elements are exaggerated for an effective description of technical contents.

The term "and/or," includes all combinations of one or more of which associated configurations may define. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In some embodiments, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or some embodiments of one or more other features, integers, steps, operations, elements, components, or combinations thereof.

Hereinafter, a quantum dot composition according to an embodiment of the present disclosure, a light emitting element, and a display device including the same will be described with reference to the accompanying drawings.

Figure 2:
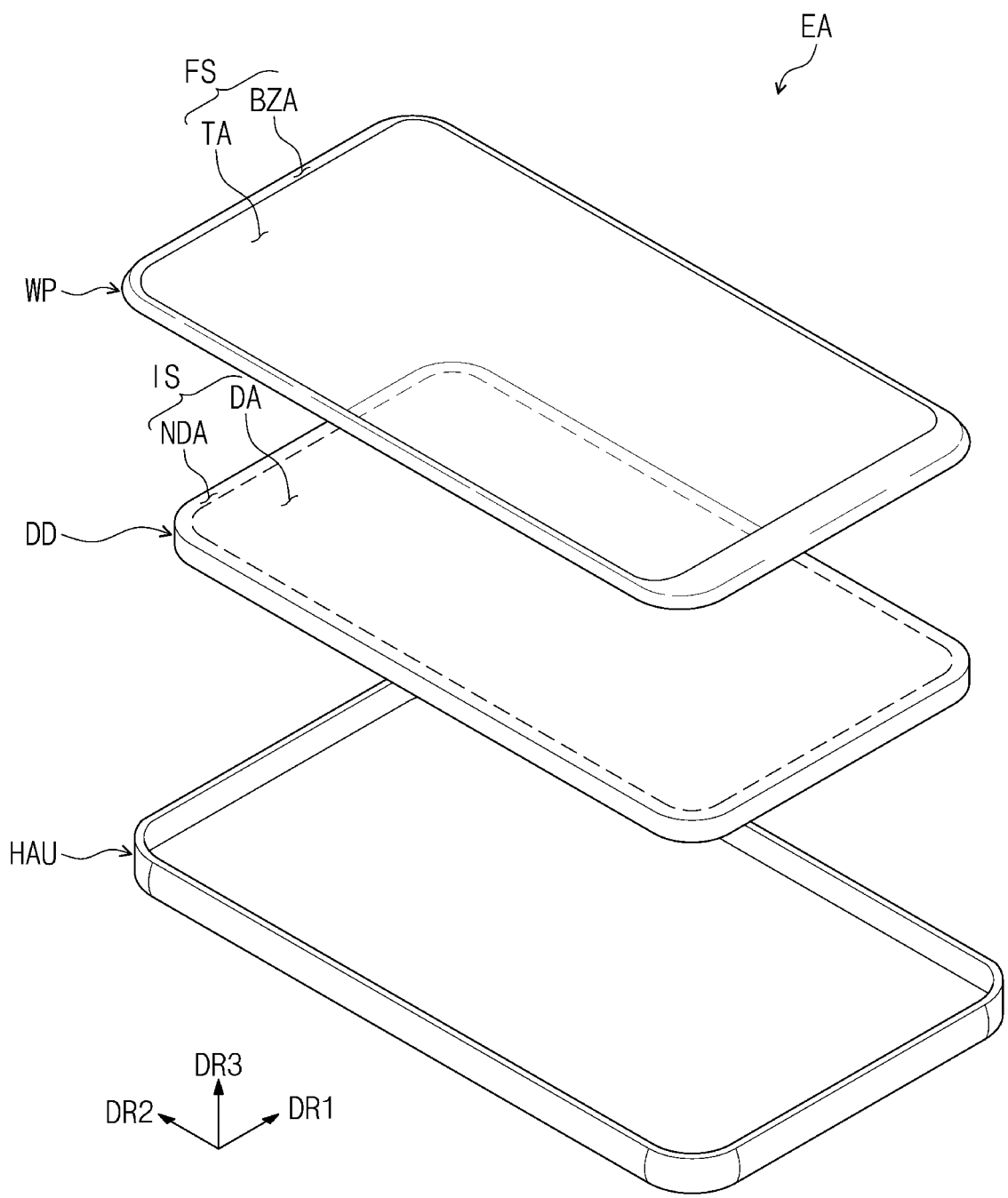
FIG. 2 is an exploded perspective view of an electronic device of an embodiment.
Figure 3:
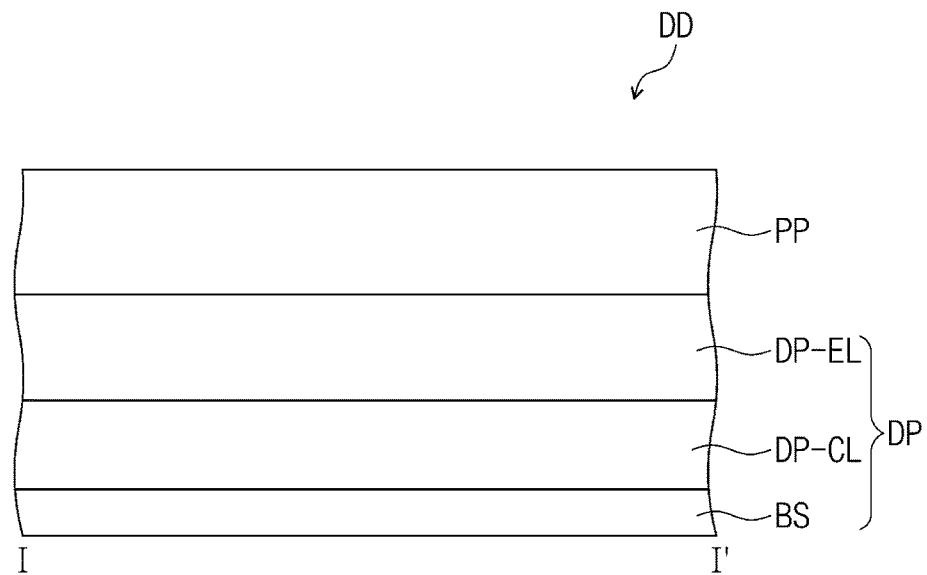
FIG. 3 is a cross-sectional view of a display device of an embodiment.
Figure 4:
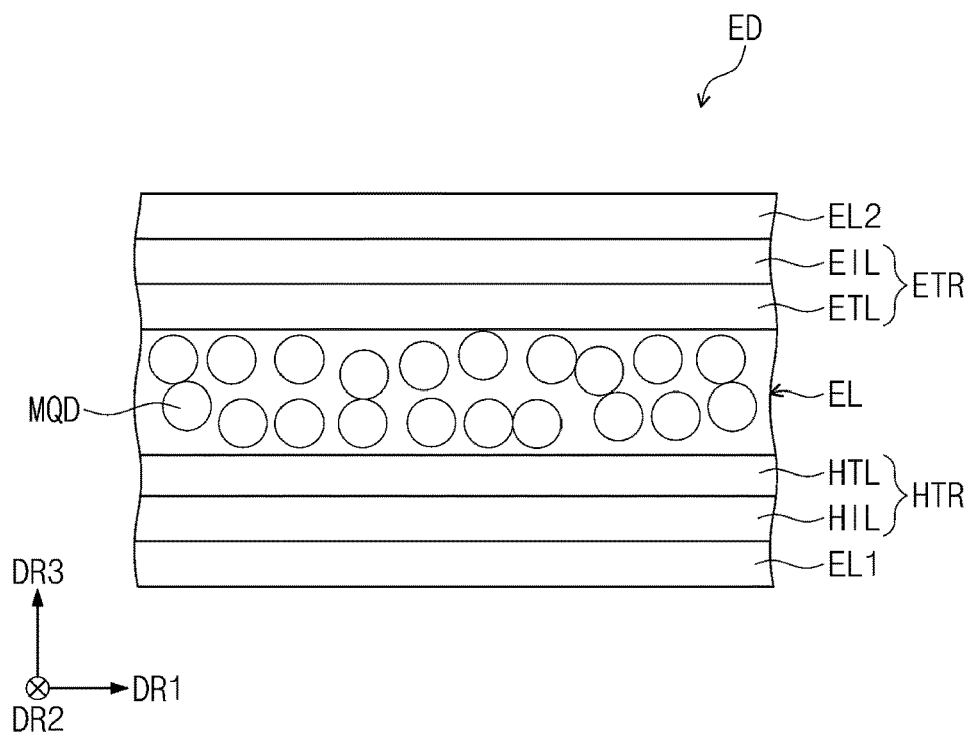
FIG. 4 is a cross-sectional view of a light emitting element of an embodiment.
Figure 5:
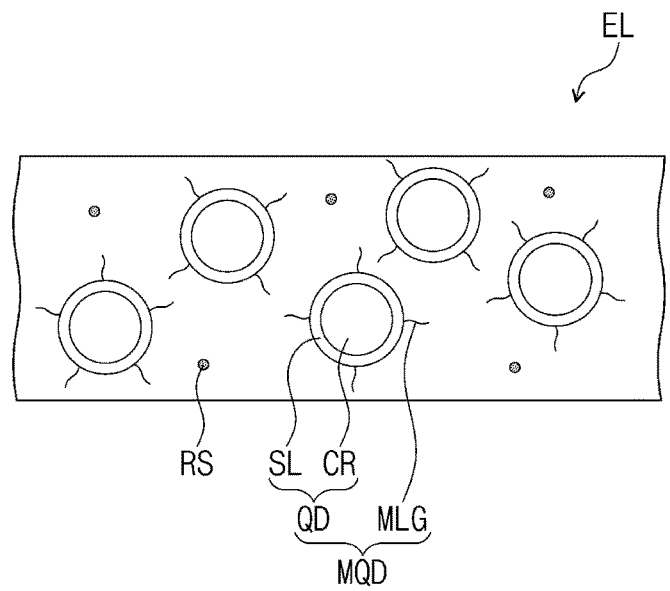
FIG. 5 is a cross-sectional view showing a part of a light emitting element of an embodiment.

FIG. 1 is a perspective view of an electronic device EA of an embodiment. FIG. 2 is an exploded perspective view of an electronic device EA of an embodiment. FIG. 3 is a cross-sectional view of a display device DD of an embodiment. FIG. 4 is a cross-sectional view of a light emitting element ED of an embodiment, and FIG. 5 is a cross-sectional view showing a part of a light emitting element according to an embodiment.

In an embodiment, an electronic device EA may be a large-sized electronic device such as a television set, a monitor, and/or an outdoor billboard. In some embodiments, the electronic device EA may be a small- and/or a medium-sized electronic device such as a personal computer, a laptop computer, a personal digital terminal, a car navigation unit, a game console, a smartphone, a tablet, and/or a camera. However, these are merely presented as an example, and other suitable electronic devices may be utilized without departing from the present disclosure. In the present embodiment, a smartphone is exemplarily illustrated as the electronic device EA.

The electronic device EA may include a display device DD and a housing HAU. The display device DD may display an image IM through a display surface IS. FIG. 1 illustrates that the display surface IS is parallel to a plane defined by a first direction DR1 and a second direction DR2 crossing the first direction DR1. However, this is presented as an example, and in some embodiments, the display surface IS of the display device DD may have a curved shape.

Among the normal directions of the display surface IS, that is, the thickness directions of the display device DD, a direction in which the image IM is displayed is indicated by a third direction DR3. A front surface (or an upper surface) and a rear surface (or a lower surface) of each member may be defined by the third direction DR3.

A fourth direction DR4 (see FIG. 16) may be a direction between the first direction DR1 and the second direction DR2. The fourth direction DR4 may be positioned on a plane parallel to the plane defined by the first direction DR1 and the second direction DR2. The directions indicated by the first to fourth directions DR1, DR2, DR3 and DR4 are relative concepts, and may thus be changed to other directions.

The display surface IS on which the image IM is displayed in the electronic device EA may correspond to a front surface of the display device DD and may correspond to a front surface FS of a window WP. Hereinafter, like reference numerals will be given for the display surface and the front surface of the electronic device EA, and the front surface of the window WP. The image IM may include a still image as well as a dynamic image. In some embodiments, the electronic device EA may include a foldable display device having a folding area and a non-folding area, and/or a bending display device having at least one bent portion.

The housing HAU may accommodate the display device DD. The housing HAU may be provided to cover the display device DD such that an upper surface, which is the display surface IS of the display device DD, is exposed. The housing HAU may cover a side surface and a bottom surface of the display device DD, and expose the overall (e.g., entire) upper surface. However, the embodiment of the present disclosure is not limited thereto, and the housing HAU may cover a part of the upper surface as well as the side and bottom surfaces of the display device DD.

In the electronic device EA of an embodiment, the window WP may include an optically transparent insulating material. The window WP may include a transmission area TA and a bezel area BZA. The front surface FS of the window WP including the transmission area TA and the bezel area BZA corresponds to the front surface FS of the electronic device EA. A user may view an image provided through the transmission area TA corresponding to the front surface FS of the electronic device EA.

In FIGS. 1 and 2, the transmission area TA is shown in a rectangular shape with rounded vertices. However, this is exemplarily illustrated, and the transmission area TA may have various suitable shapes and is not limited to any one embodiment.

The transmission area TA may be an optically transparent area. The bezel area BZA may be an area having a relatively lower light transmittance than the transmission area TA. The bezel area BZA may have a predetermined (or set) color. The bezel area BZA may be adjacent to the transmission area TA and may surround the transmission area TA. The bezel area BZA may define the shape of the transmission area TA. However, the embodiment of the present disclosure is not limited to the one illustrated, and the bezel area BZA may be adjacent only to one side of the transmission area TA, and a part thereof may be omitted.

The display device DD may be under the window WP. In the present description, "below" may indicate a direction opposite to the direction in which the display device DD provides (e.g., displays) an image.

In an embodiment, the display device DD may be substantially configured to generate an image IM. The image IM generated in the display device DD is displayed on the display surface IS, and is viewed by a user through the transmission area TA from the outside. The display device DD includes a display area DA and a non-display area NDA. The display area DA may be an area activated according to electrical signals. The non-display area NDA may be an area covered by the bezel area BZA. The non-display area NDA is adjacent to the display area DA. The non-display area NDA may surround the display area DA.

The display device DD may include a display panel DP and a light control layer PP on the display panel DP. The display panel DP may include a display element layer DP-EL. The display element layer DP-EL includes a light emitting element ED.

Figure 17:
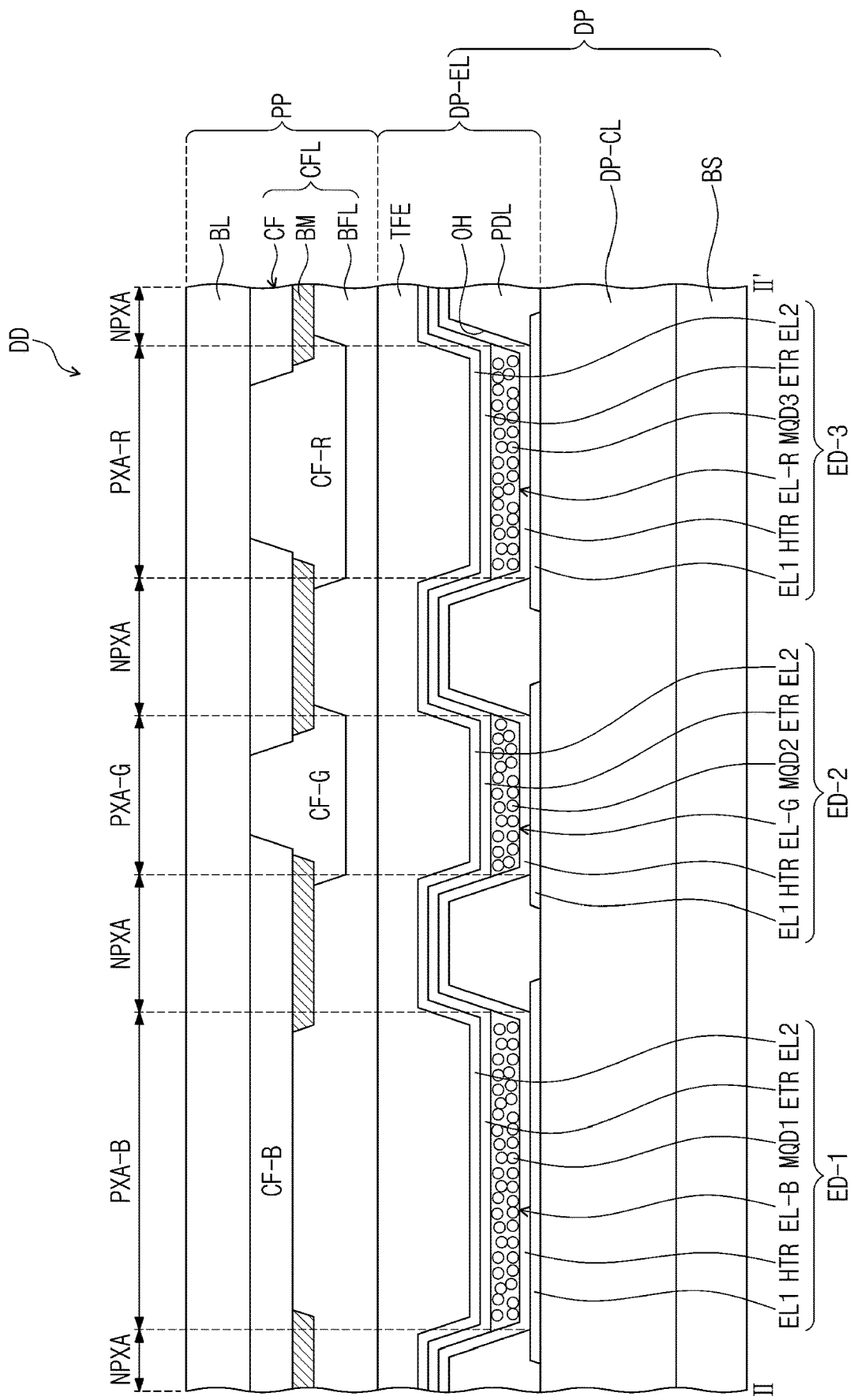
FIGS. 17 and 18 are cross-sectional views of a display device of an embodiment.

The display device DD may include a plurality of light emitting elements ED-1, ED-2, and ED-3 (see FIG. 17). The light control layer PP may be on the display panel DP to control reflected light from the display panel DP, e.g., external light reflected light from the display panel DP. The light control layer PP may include, for example, a polarizing layer and/or a color filter layer.

In the display device DD of an embodiment, the display panel DP may be a light emitting display panel. For example, the display panel DP may be a quantum dot light emitting display panel including a quantum dot light emitting element. However, the embodiments of the present disclosure are not limited thereto.

The display panel DP may include a base substrate BS, a circuit layer DP-CL on the base substrate BS, and a display element layer DP-EL on the circuit layer DP-CL.

The base substrate BS may be a member providing a base surface on which the display element layer DP-EL is positioned. The base substrate BS may be a glass substrate, a metal substrate, a plastic substrate, etc. However, the embodiment of the present disclosure is not limited thereto, and the base substrate BS may be an inorganic layer, an organic layer, or a composite material layer (e.g., including an inorganic material and an organic material). The base substrate BS may be a flexible substrate that may be readily bent and/or folded.

In an embodiment, the circuit layer DP-CL may be on the base substrate BS, and the circuit layer DP-CL may include a plurality of transistors. The transistors may each include a control electrode, an input electrode, and an output electrode. For example, the circuit layer DP-CL (may include a switching transistor and a driving transistor) to drive the light emitting element ED of the display element layer DP-EL.

FIG. 4 is a view showing a light emitting element ED according to an embodiment, and referring to FIG. 4, the light emitting element ED according to an embodiment includes a first electrode EL1, a second electrode EL2 facing the first electrode EL1, and a plurality of functional layers between the first electrode EL1 and the second electrode EL2 and including an emission layer EL.

The plurality of functional layers may include a hole transport region HTR between the first electrode EL1 and the emission layer EL, and an electron transport region ETR between the emission layer EL and the second electrode EL2. In some embodiments, a capping layer may be further provided on the second electrode EL2 in an embodiment.

The hole transport region HTR and the electron transport region ETR each may include a plurality of sub functional layers. For example, the hole transport region HTR may include a hole injection layer HIL and a hole transport layer HTL as sub functional layers, and the electron transport region ETR may include an electron injection layer EIL and an electron transport layer ETL as sub functional layers. However, the embodiment of the present disclosure is not limited thereto, and the hole transport region HTR may further include an electron blocking layer as a sub functional layer, and the electron transport region ETR may further include a hole blocking layer as a sub functional layer.

In the light emitting element ED according to an embodiment, the first electrode EL1 has conductivity. The first electrode EL1 may be formed of a metal alloy or any suitable conductive compound. The first electrode EL1 may be an anode. The first electrode EL1 may be a pixel electrode.

In the light emitting element ED according to an embodiment, the first electrode EL1 may be a reflective electrode. However, the embodiment of the present disclosure is not limited thereto. For example, the first electrode EL1 may be a transmissive electrode, or a transflective electrode. When the first electrode EL1 is a transflective electrode or a reflective electrode, the first electrode EU may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (e.g., a mixture of Ag and Mg). In some embodiments, the first electrode EL1 may have a multi-layer structure including a reflective film or a transflective film formed of any of the suitable materials described above as an example, and a transparent conductive film formed of indium tin oxide (ITO), indium zinc oxide (IZO), zinc oxide (ZnO), indium tin zinc oxide (ITZO), etc. For example, the first electrode EL1 may be a multi-layer metal film, and may have a stack structure of metal films of ITO/Ag/ITO.

The hole transport region HTR is provided on the first electrode EL1. The hole transport region HTR may include a hole injection layer HIL, a hole transport layer HTL, etc. In some embodiments, the hole transport region HTR may further include at least one of a hole buffer layer or an electron blocking layer EBL, in addition to the hole injection layer HIL and the hole transport layer HTL. The hole buffer layer may compensate a resonance distance according to the wavelength of light emitted from an emission layer EL, and may thus increase luminous efficiency. Materials which may be included in the hole transport region HTR may be used as materials included in the hole buffer layer. The electron blocking layer is a layer that serves to prevent or reduce the injection of electrons from the electron transport region ETR to the hole transport region HTR.

The hole transport region HTR may have a single layer formed of (e.g., consisting of) a single material, a single layer formed of a plurality of different materials, or a multi-layer structure including a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in the stated order from the first electrode EL1, but the embodiment is not limited thereto.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PAN I/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole-based derivatives (such as N-phenyl carbazole and/or polyvinyl carbazole), fluorine-based derivatives, N,N'-bis(3-methylphenyl)-N,N'-diphenyl-[1,1-biphenyl]-4, 4'-diamine (TPD), triphenylamine-based derivatives (such as 4,4',4"-tris(N-carbazolyl)triphenylamine (TCTA)), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The emission layer EL is provided on the hole transport region HTR. In the light emitting element ED according to an embodiment, the emission layer EL may include a quantum dot containing a hydrophilic group. The hydrophilic group-containing quantum dot MQD included in the emission layer EL may have a hydrophilic group MLG bonded to a surface of the quantum dot QD. The hydrophilic group-containing quantum dot MQD has a functional group, which is a hydrophilic group MLG, bonded to the surface thereof, and may thus have a modified surface. Hereinafter, the hydrophilic group-containing quantum dot MQD is referred to as a surface-modified quantum dot MQD.

A quantum dot QD forming the surface-modified quantum dot MQD may include a core CR and a shell SL surrounding the core CR. The hydrophilic group MLG may be bonded to a surface of the shell SL, which is a surface of the quantum dot QD.

The hydrophilic group MLG may be a functional group that remains after a part of a ligand bonded to the surface of a quantum dot is dissociated in the quantum dot composition, which will be described below in more detail. The hydrophilic functional group MLG may be derived from the reaction between a ligand bonded to the surface of the quantum dot and a ligand-removal agent in the quantum dot composition. The hydrophilic group MLG may be derived from a nucleophilic attack reaction between a ligand and a ligand-removal agent. For example, the hydrophilic group MLG may include a thiol group (*—SH) or a hydroxyl group (*—OH). In the present description, "*—" refers to a position to be connected.

The emission layer EL in the light emitting element ED of an embodiment may be formed from the quantum dot composition of an embodiment. The quantum dot composition of an embodiment includes a quantum dot and a ligand bonded to the quantum dot surface. The quantum dot composition of an embodiment may include a quantum dot, a ligand bonded to the quantum dot surface, and a ligand-removal agent.

The emission layer EL may include a plurality of surface-modified quantum dots MQD. The surface-modified quantum dots MQD included in the emission layer EL may be stacked to form a layer. In FIG. 4, for example, the surface-modified quantum dots MQD having a circular cross-section are arranged to form two layers, but the embodiments are not limited thereto. For example, the arrangement of the surface-modified quantum dots MQD may vary according to the thickness of the emission layer EL, the shape of the quantum dot QD included in the emission layer EL, and the average diameter of the quantum dots QD. For example, in the emission layer EL, the surface-modified quantum dots MQD may be aligned to be adjacent to each other to form a single layer, or may be aligned to form a plurality of layers such as two or three layers.

The emission layer EL may have, for example, a thickness of about 5 nm to about 20 nm, or about 10 nm to about 20 nm.

As described above, the emission layer EL includes surface-modified quantum dots MQD formed from the quantum dot composition of the present embodiments. In some embodiments, the emission layer EL may include a small amount of ligand residues RS derived from the ligand of the quantum dot composition of an embodiment. The ligand residues RS may be derived from the reaction between a ligand bonded to the quantum dot surface and a ligand-removal agent. The ligand residues RS may include a metal and an organic ligand. In an embodiment, the ligand residues RS may include a metal oxide, a metal sulfide, and/or a complex in which an organic ligand is coordinated to a metal. The organic ligand included in the ligand residues RS may include at least one among (e.g., at least one selected from) (—O(O)—CNR), (—S(S)—CNR), (—O(O)—COR), (—S(S)—COR), (—O(O)—CR), and (—S(S)—CR).

In the light emitting element ED of an embodiment, the surface-modified quantum dots MQD included in the emission layer EL are quantum dots QD the surface of which has been modified. The quantum dot QD included in the emission layer EL of an embodiment may be a semiconductor nanocrystal that may be selected from a Group II-VI compound, a Group III-V compound, a Group IV-VI compound, a Group IV element, a Group IV compound, and combinations thereof.

The Group II-VI compound may be selected from a binary compound selected from CdS, CdSe, CdTe, ZnS, ZnSe, ZnTe, ZnO, HgS, HgSe, HgTe, MgSe, MgS, and a mixture thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, HgZnS, CdHgS, CdHgSe, CdHgTe, HgZnS, HgZnSe, HgZnTe, MgZnSe, MgZnS, and a mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; and a quaternary compound selected from SnPbSSe, SnPbSeTe, SnPbSTe, and a mixture thereof. The Group IV element may be selected from Si, Ge, and a mixture thereof. The Group IV compound may be a binary compound selected from SiC, SiGe, and a mixture thereof.

In some embodiments, a binary compound, a ternary compound, and/or a quaternary compound may each independently be present in a particle in a uniform concentration distribution, or may be present in the same particle in a partially different concentration distribution. In some embodiments, a core/shell structure in which one quantum dot surrounds another quantum dot may be present. An interface between a core and a shell may have a concentration gradient in which the concentration of an element present in a shell becomes lower (decreases) toward the center.

In some embodiments, a quantum dot QD may have the core/shell structure including a core CR having one or more nanocrystals described above, and a shell SL surrounding the core CR. The shell SL of the quantum dot QD having the core/shell structure may serve as a protection layer to prevent or reduce the chemical deformation of the core CR so as to maintain semiconductor properties, and/or as a charging layer to impart electrophoresis properties to the quantum dot QD. The shell SL may be a single layer or multiple layers. An interface between the core CR and the shell SL may have a concentration gradient in which the concentration of an element present in the shell SL becomes lower (decreases) toward the center. An example of the shell SL of the quantum dot QD having the core/shell structure may be a metal or non-metal oxide, a semiconductor compound, or a combination thereof.

For example, the metal or non-metal oxide may be a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but the embodiments of the present disclosure are not limited thereto.

In some embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiments of the present disclosure are not limited thereto.

A quantum dot QD may have a full width of half maximum (FWHM) of a light emission wavelength spectrum of about 45 nm or less, for example, about 40 nm or less, or about 30 nm or less, and color purity and/or color reproducibility may be enhanced in the above range. In some embodiments, light emitted through such a quantum dot is emitted in all directions, and thus a wide viewing angle may be improved.

The form of a quantum dot QD is not particularly limited as long as it is a suitable form, and for example, a quantum dot in the form of spherical, pyramidal, multi-arm, and/or cubic nanoparticles, nanotubes, nanowires, nanofibers, nanoparticles, etc. may be used.

A quantum dot QD may control the color of emitted light according to the particle size thereof, and thus the quantum dot QD may have various suitable light emission colors such as blue, red, green, etc. The smaller the particle size of the quantum dot QD, the shorter the wavelength region of light to be emitted. For example, in the quantum dot QD having the same core, the particle size of a quantum dot emitting green light may be smaller than the particle size of a quantum dot emitting red light. In some embodiments, in the quantum dot QD having the same core, the particle size of a quantum dot emitting blue light may be smaller than the particle size of a quantum dot emitting green light. However, the embodiment of the present disclosure is not limited thereto, and even in the quantum dot QD having the same core, the particle size may be adjusted according to materials and thickness of a shell.

When a quantum dot QD is to provide (or has) various light emission colors such as blue, red, green, etc., the quantum dot QD providing (or having) a different light emission color may have a different core material.

In some embodiments, in the light emitting element ED of an embodiment, an emission layer EL may include a host and a dopant. In an embodiment, the emission layer EL may include a quantum dot QD as a dopant material. In some embodiments, the emission layer EL may further include a host material.

In the light emitting element ED of an embodiment, an emission layer EL may emit fluorescence. For example, the quantum dot QD may be used as a fluorescent dopant material.

The emission layer EL may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

In the light emitting element ED of an embodiment, an electron transport region ETR is provided on the emission layer EL. The electron transport region ETR may include at least one among (e.g., selected from) a hole blocking layer, an electron transport layer ETL, and an electron injection layer EIL, but the embodiment of the present disclosure is not limited thereto.

The electron transport region ETR may have a single layer formed of (e.g., consisting of) a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, or a hole blocking layer/electron transport layer ETL/electron injection layer EIL are stacked in the stated order from the emission layer EL, but is not limited thereto. The thickness of the electron transport region ETR may be, for example, from about 200 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($zBebq_2$), 9,10-di(naphthalene-2-yl)anthracene (ADN), or a mixture thereof. The thickness of the electron transport layer ETL may be from about 100 Å to about 1,000 Å and may be, for example, from about 150 Å to about 500 Å. When the thicknesses of the electron transport layer ETL satisfies any of the above-described ranges, satisfactory (or suitable) electron transport properties may be obtained without a substantial increase in driving voltage.

When the electron transport region ETR includes the electron injection layer EIL, the electron transport region ETR may include a halogenated metal, a metal oxide, a lanthanide metal, or a co-deposited material of a halogenated metal and a lanthanide metal. The halogenated metal may be an alkali metal halide. For example, the electron transport region ETR may include LiF, lithium quinolate (Liq), $Li_2O$, BaO, NaCl, CsF, Yb, RbCl, RbI, KI, CuI, and/or KI:Yb, but the embodiment of the present disclosure is limited thereto. The electron injection layer EIL may also be formed of a mixture material of an electron transport material and an insulating organo-metal salt. The organo-metal salt may include, for example, one or more selected from metal acetates, metal benzoates, metal acetoacetates, metal acetylacetonates, and metal stearates. The thicknesses of the electron injection layer EIL may be from about 1 Å to about 100 Å, and, for example, from about 3 Å to about 90 Å. When the thickness of the electron injection layer EIL satisfies any of the above-described ranges, satisfactory (or suitable) electron injection properties may be obtained without a substantial increase in driving voltage.

The electron transport region ETR may include a hole blocking layer as described above. The hole blocking layer may include, for example, at least one of 2,9-dimethyl-4,7-diphenyl-1,10-phenanthroline (BCP) or 4,7-diphenyl-1,10-phenanthroline (Bphen), but is not limited thereto.

The second electrode EL2 is provided on the electron transport region ETR. The second electrode EL2 may be a common electrode and/or a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (e.g., a mixture of Ag and Mg). For example, the second electrode EL2 may include AgMg, AgYb, and/or MgAg. In some embodiments, the second electrode EL2 may have a multilayer structure including a reflective film or a transflective film formed of any of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with the auxiliary electrode, the resistance of the second electrode EL2 may decrease.

Figure 6:
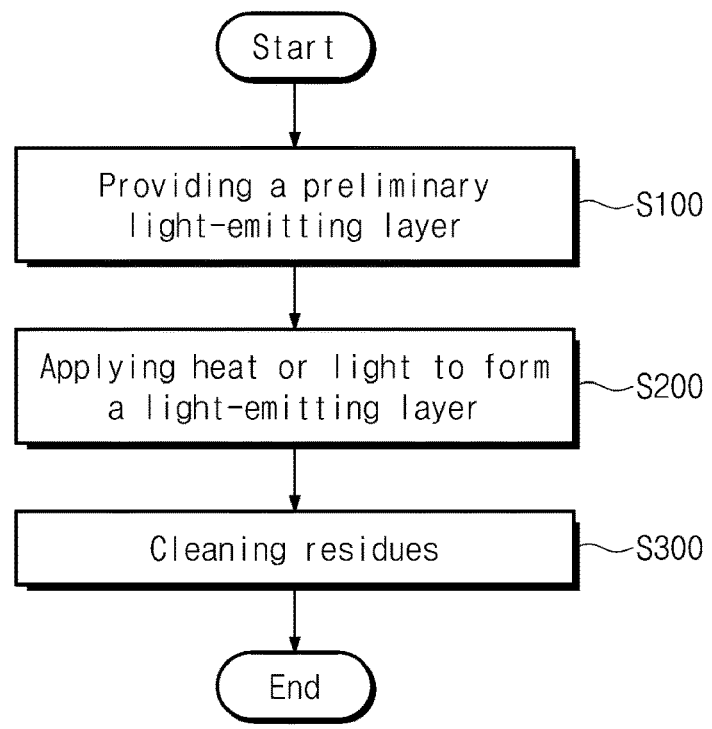
FIG. 6 is a flowchart showing a method for manufacturing a light emitting element according to an embodiment.
Figure 7:
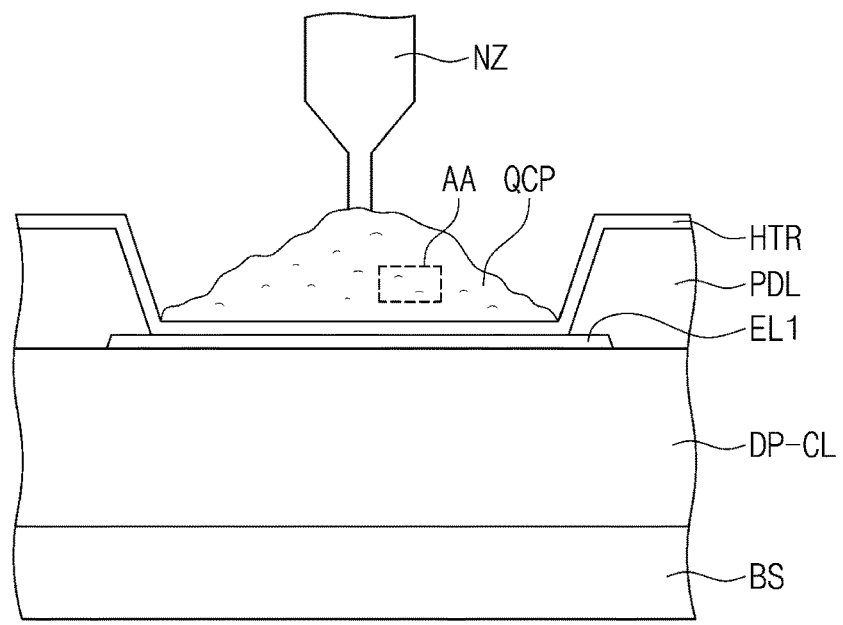
FIG. 7 is a schematic view showing one or more acts of a method for manufacturing a light emitting element according to an embodiment.
Figure 8:
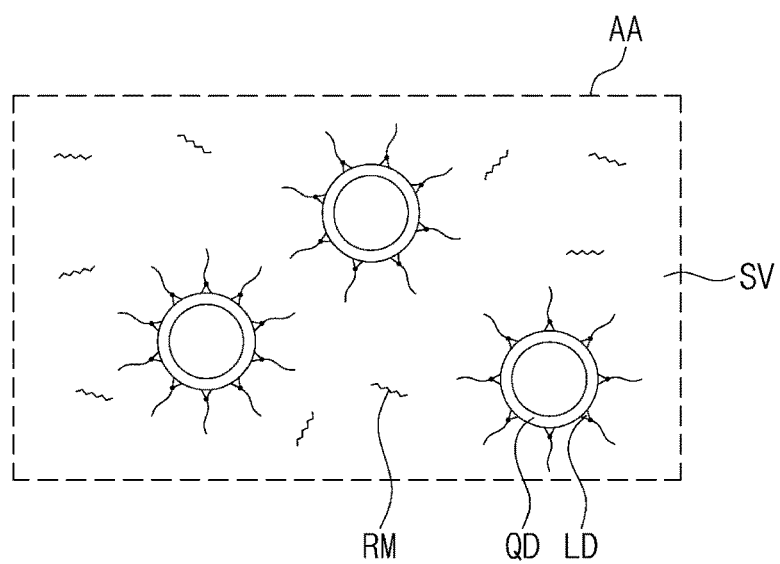
FIG. 8 is a schematic view illustrating a quantum dot composition according to an embodiment.
Figure 9:
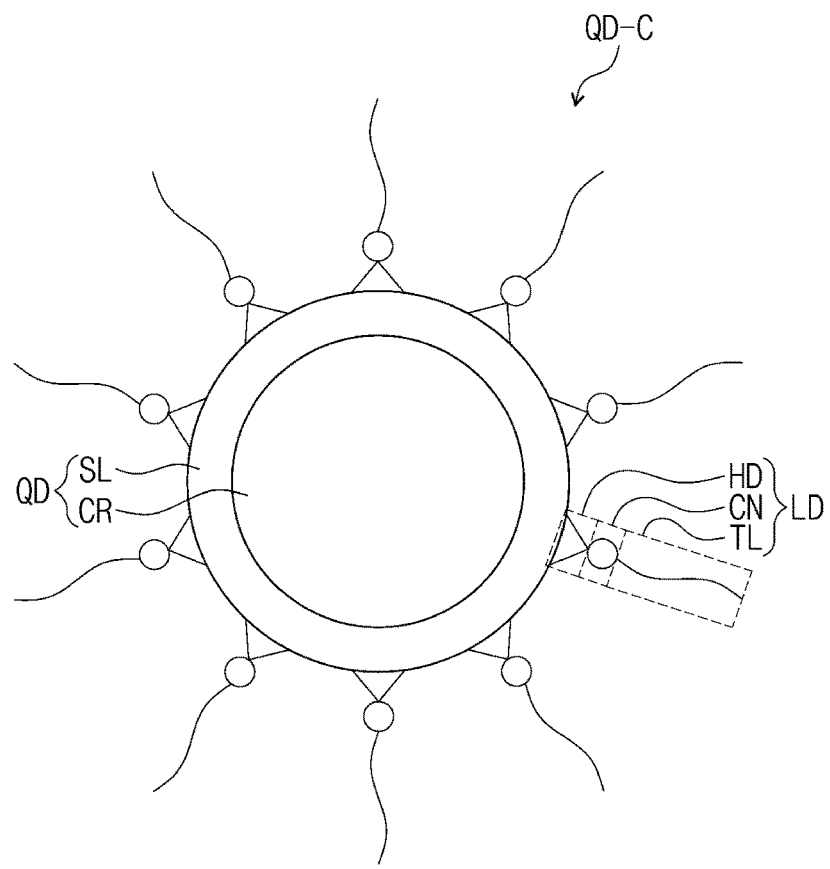
FIG. 9 is a schematic view illustrating a quantum dot and a ligand included in a quantum dot composition of an embodiment.
Figure 10:
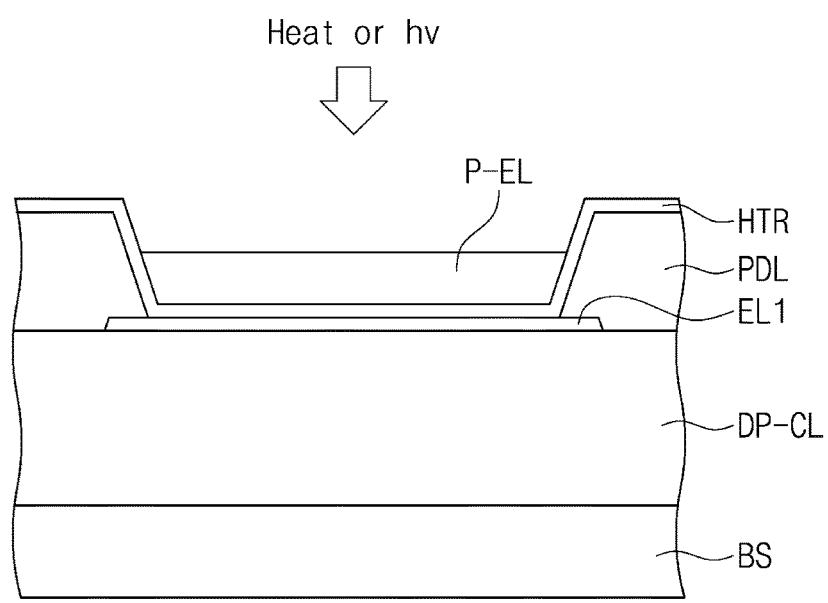
FIG. 10 is a schematic view illustrating one or more acts of a method for manufacturing a light emitting element according to an embodiment.

FIG. 6 is a flowchart showing a method for manufacturing a light emitting element according to an embodiment. FIG. 7 is a schematic view showing a part of (e.g., one or more acts of) a method for manufacturing a light emitting element according to an embodiment. FIG. 8 is a schematic view illustrating a quantum dot composition according to an embodiment. FIG. 9 is a schematic view illustrating a quantum dot and a ligand included in a quantum dot composition of an embodiment. FIG. 10 is a schematic view illustrating a part of (e.g., one or more acts of) a method for manufacturing a light emitting element according to an embodiment.

A method for manufacturing a light emitting element according to an embodiment includes providing a preliminary emission (light-emitting) layer (S100), providing heat or light to form an emission (light-emitting) layer (S200), and cleaning ligand residues (S300).

FIG. 7 is a schematic view showing the forming of an emission layer in a method for manufacturing a light emitting element according to an embodiment. The forming of an emission layer may include providing a quantum dot composition QCP on a hole transport region HTR. The quantum dot composition QCP may be provided between portions of a pixel defining layer PDL through a nozzle NZ.

FIG. 8 is a view illustrating a part (a region "AA") of the quantum dot composition QCP provided in FIG. 7 in more detail. FIG. 9 is a schematic view illustrating a quantum dot composite QD-C including a structure in which a ligand LD is bonded to a surface of a quantum dot QD. FIG. 10 is a schematic view illustrating a bonding relationship of a structure in which a ligand LD is bonded to a surface of a quantum dot QD in a quantum dot composition.

Referring to FIGS. 7 to 9, a quantum dot composition QCP of an embodiment may include a quantum dot composite QD-C including a quantum dot QD and a ligand LD bonded to a quantum dot QD surface. The quantum dot composition QCP may further include an organic solvent SV in which the quantum dot QD and the ligand LD are dispersed. The organic solvent SV may be a non-polar organic solvent. For example, the organic solvent may include hexane, toluene, chloroform, dimethyl sulfoxide, dimethyl formamide, etc. However, the embodiment of the present disclosure is not limited thereto. The quantum dot composition QCP may further include a ligand-removal agent RM to react with a specific part of the ligand LD and to dissociate the part of the ligand LD.

The quantum dot QD may be provided by being dispersed in the organic solvent SV. The ligand LD may be bonded to the surface of the quantum dot QD to increase the dispersibility of the quantum dot composite QD-C in the organic solvent SV. In the forming of an emission layer, providing of the quantum dot composition QCP may be followed by applying heat to evaporate the organic solvent SV. The evaporating of the organic solvent SV may be performed in one process together with the applying of heat to dissociate the ligand LD.

As described above, the quantum dot QD may include a core CR and a shell SL surrounding the core CR. However, the embodiment of the present disclosure is not limited thereto, and the quantum dot QD may have a single-layer structure or a plurality of shells. Here, the description on the quantum dot QD in the light emitting element ED of an embodiment described with reference to FIGS. 4 and 5 may be equally applied to a quantum dot QD included in the quantum dot composition QCP of an embodiment.

The ligand LD includes a head portion HD bonded to a quantum dot QD surface, a connecting portion CN, and a tail portion TL. The connecting portion CN of the ligand LD includes a metal. The tail portion TL of the ligand LD may be coordinated to the metal of the connecting portion CN. The tail portion TL and the head portion HD of the ligand LD may be coordinated to the metal of the connecting portion CN.

The connecting portion CN of the ligand LD may include at least one among (e.g., selected from) Cd, Zn, In, Sn, Sb, Ga, Ge, As, Hg, Ni, Pd, Pt, Co, Rh, Ir, Fe, Ru, Os, Mn, Mo, and Cr. The connecting portion CN may be a portion with which a ligand-removal agent RM included in the quantum dot composition QCP reacts.

In an embodiment, the ligand LD may include a structure of an organic ligand, which is an organic material. In an embodiment, the tail portion TL of the ligand LD may include at least one among (e.g., selected from) (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide connecting atom (S, Se, Te), an oxygen atom, and a nitrogen atom. In the tail portion TL of the ligand LD, R may be an alkyl group having 1 to 20 carbon atoms. In an embodiment, the tail portion TL may include, for example, a (—S(S)—C—N—R) structure, and R may be an unsubstituted hexyl group.

The head portion HD of the ligand LD is a portion bonded to the surface of the quantum dot QD, and may include a functional group to bind to the surface of the quantum dot QD. The head portion HD of the ligand LD may include at least one thiol group and/or at least one hydroxy group. The head portion HD of the ligand LD may include one thiol group, two thiol groups, and/or a dithioic acid group. In some embodiments, the head portion HD may include two hydroxy groups and/or a carboxylic acid group. When the head portion HD includes a single functional group to bind to the surface of the quantum dot QD, the ligand LD may be a monodentate ligand. When the head portion HD includes two functional groups to bind to the surface of the quantum dot QD, the ligand LD may be a bidentate ligand. The head portion HD may include a functional group to bind to the surface of a shell SL of the quantum dot QD.

In the quantum dot composition QCP of an embodiment, the ligand may be represented by Formula 1 below:

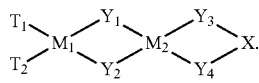

Formula 1

In Formula 1, $T_1$ and $T_2$ may each independently be a thiol group or a hydroxyl group. $T_1$ and $T_2$ may be the same as or different from each other. In an embodiment, both $T_1$ and $T_2$ may be thiol groups.

In Formula 1, $M_1$ and $M_2$ may each independently be at least one selected from Cd, Zn, In, Sn, Sb, Ga, Ge, As, Hg, Ni, Pd, Pt, Co, Rh, Ir, Fe, Ru, Os, Mn, Mo, and Cr. $M_1$ and $M_2$ may be the same as or different from each other. In an embodiment, $M_1$ may be Sn and $M_2$ may be Zn.

In Formula 1, $Y_1$ to $Y_4$ may each independently be O or S. $Y_1$ to $Y_4$ may be the same as or different from each other. In an embodiment, both $Y_1$ and $Y_2$ may be S.

In Formula 1, X may be a substituted or unsubstituted amine group, a substituted or unsubstituted oxy group, a substituted or unsubstituted thio group, a substituted or unsubstituted ester group, a substituted or unsubstituted amide group, or a substituted or unsubstituted alkyl group having 1 to 20 carbon atoms. In an embodiment, X may be a substituted or unsubstituted alkyl amine group. In an embodiment, X may be an unsubstituted hexyl amine group.

In the present description, the term "substituted or unsubstituted" may refer to a functional group that is unsubstituted or that is substituted with at least one substituent selected from a deuterium atom, a halogen atom, a cyano group, a nitro group, an amine group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. In some embodiments, each of the substituents exemplified above may be substituted or unsubstituted. For example, a biphenyl group may be interpreted as an aryl group or as a phenyl group substituted with a phenyl group.

FIG. 10 is a schematic view illustrating the forming of an emission layer by providing heat or light (S200) in a method for manufacturing a light emitting element according to an embodiment. In FIG. 10, the providing of heat or light (hv) to a preliminary emission layer P-EL is illustrated. The providing of heat to the preliminary emission layer P-EL may be performed by providing heat of a temperature of 50° C. or higher to the preliminary emission layer P-EL for baking. The baking may be performed by removing an organic solvent SV, etc. included in the quantum dot composition QCP. For example, the providing of heat to the preliminary emission layer P-EL may be performed by providing heat of a temperature of 100° C. or higher to remove the organic solvent SV included in the preliminary emission layer P-EL and induce a nucleophilic attack reaction between a ligand-removal agent RM and a ligand LD. The providing of light to the preliminary emission layer P-EL may be performed by providing ultraviolet light to the preliminary emission layer P-EL to induce a radical reaction between the ligand-removal agent RM and the ligand LD. The forming of the emission layer according to some embodiments may include providing light to induce a radical reaction between the ligand-removal agent RM and the ligand LD, and then providing heat to remove an organic solvent for baking.

Figure 11:
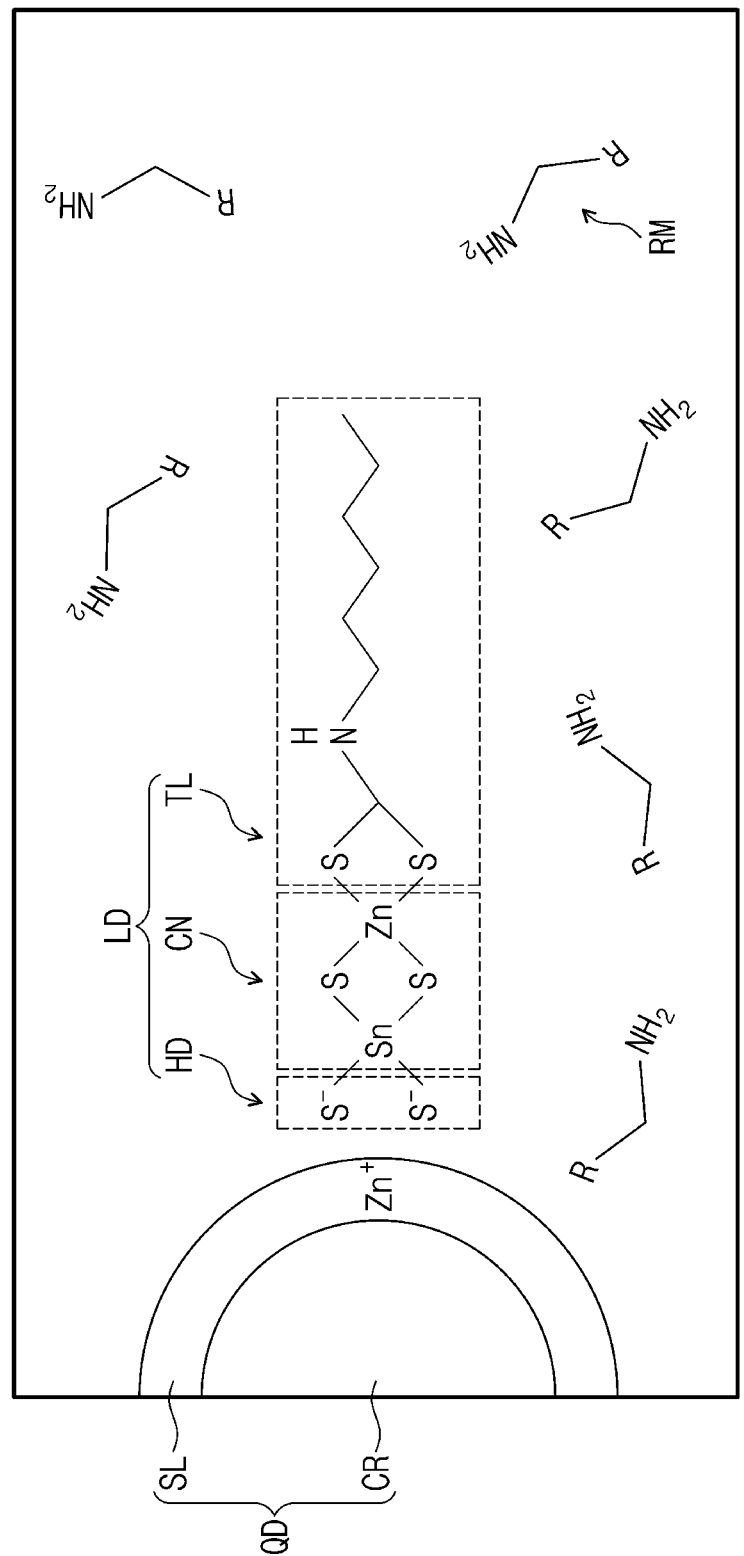
FIG. 11 is a schematic view showing a quantum dot composition according to an embodiment.

FIG. 11 is a schematic view illustrating a quantum dot composition according to an embodiment. FIG. 11 exemplarily illustrates a quantum dot QD provided to a preliminary emission layer P-EL, a ligand LD bonded to a quantum dot surface, and a ligand-removal agent RM. In FIG. 11, the quantum dot QD may include a core CR and a shell SL. The ligand LD may include a head portion HD bonded to the quantum dot QD, a connecting portion CN containing a metal, and a tail portion TL exposed to the outside. In FIG. 11, a structure in which the head portion HD includes two thiol group derivatives, the connecting portion CN includes Sn and Zn as a metal, and the tail portion TL is an alkylamine group is exemplarily illustrated. The ligand-removal agent RM is exemplarily illustrated to be an alkyl amine compound containing R, where R is an alkyl group having 6 to 10 carbon atoms.

Figure 12A:
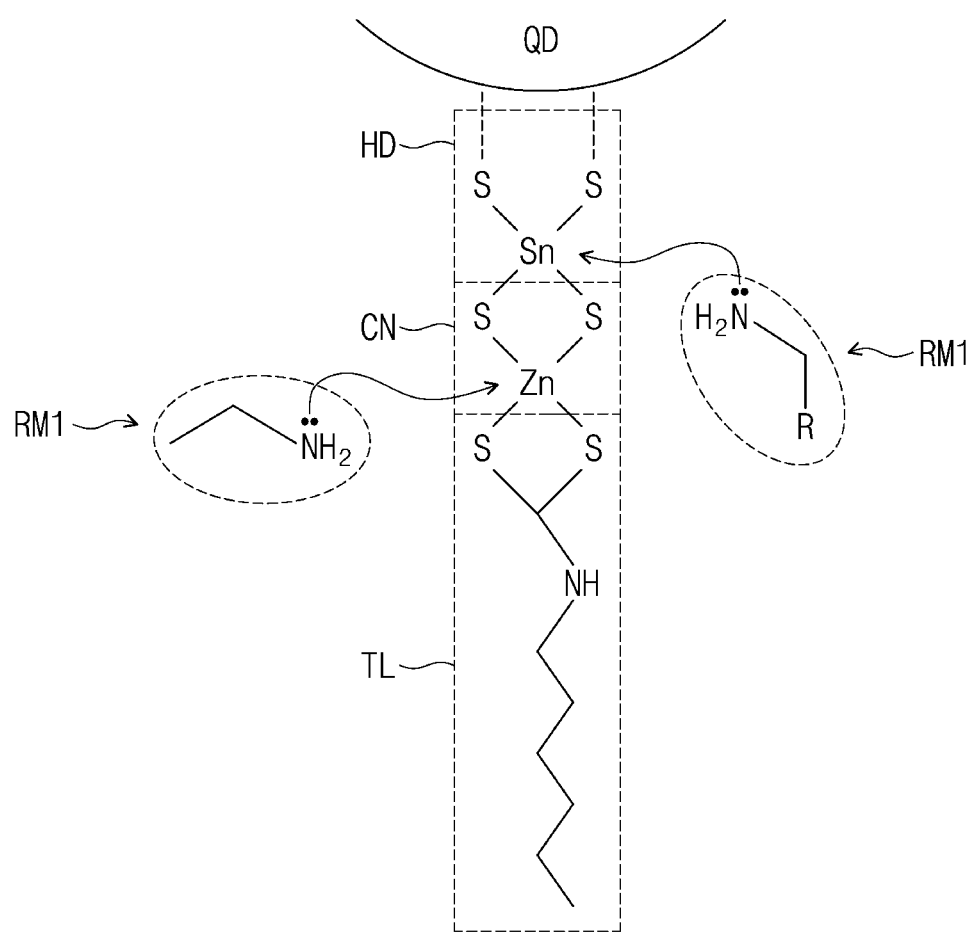
FIGS. 12A and 12B are views exemplarily showing a ligand-removal reaction in a quantum dot composition according to an embodiment.
Figure 12B:
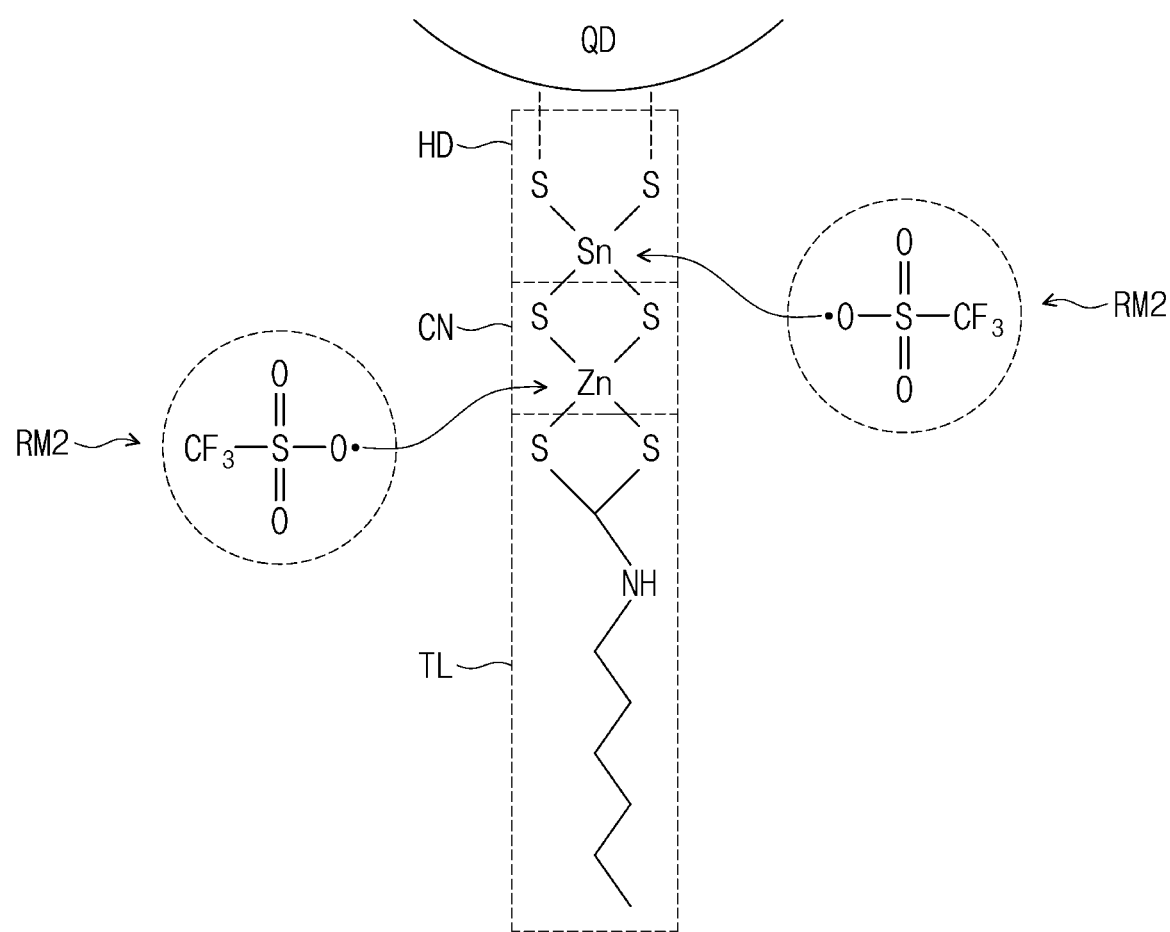

FIGS. 12A and 12B are views exemplarily illustrating a ligand-removal reaction in a quantum dot composition according to an embodiment. FIGS. 12A and 12B exemplarily illustrate reaction between a ligand-removal agent and a ligand bonded to a surface of a quantum dot in a quantum dot composition of an embodiment.

As illustrated in FIG. 12A, an amine compound

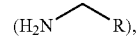

which is a ligand-removal agent RM1, functions as a nucleophilic reactor, attacking a metal included in the connecting portion CN out of the ligand LD bonded to the surface of the quantum dot QD, to separate parts of the ligand LD corresponding to the connecting portion CN and the tail portion TL from the surface of the quantum dot QD. The ligand residues RS (see FIG. 5) generated after the reaction between the ligand-removal agent RM1 and the ligand LD may include portions corresponding to the connecting portion CN and the tail portion TL dissociated from the quantum dot QD. For example, the ligand residues may include at least one selected from Cd, Zn, In, Sn, Sb, Ga, Ge, As, Hg, Ni, Pd, Pt, Co, Rh, Ir, Fe, Ru, Os, Mn, Mo, and Cr, which are metals that may be included in the connecting portion CN. The ligand residues may include an organic ligand derived from the tail portion TL and an organic ligand derived from the ligand-removal agent RM1. A part of the organic ligand may be included in a form coordinated to the metal. The organic ligand part derived from the ligand-removal agent RM1 may be included in a form coordinated to a metal. The ligand residues may include at least one selected from (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide linking atom (S, Se, Te), an oxygen atom, and a nitrogen atom. The ligand residues may include a substituent included in the ligand-removal agent RM1. "R" may be an alkyl group in the ligand-removal agent illustrated in FIG. 12A and in the residues. For example, "R" may be an alkyl group having 1 to 20 carbon atoms. For example, "R" may be an alkyl group having 6 to 10 carbon atoms.

As illustrated in FIG. 12B, a ligand-removal agent RM2 may be a radical reactor derived from trifluromethane sulfonic acid

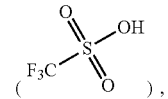

and may attack a metal included in the connecting portion CN out of the ligand LD bonded to the surface of the quantum dot QD, to separate portions corresponding to the connecting portion CN and tail portion TL from the surface of the quantum dot QD. In the quantum dot composition according to the embodiments, the radical reaction may be initiated by applying ultraviolet light to a photoacid generator to form radicals. The ligand residues may include a substituent included in the ligand-removal agent RM2.

The nucleophilic attack reaction and the radical reaction may leave only a hydrophilic functional group, such as a thiol group and/or a hydroxyl group, (which may correspond to the head portion HD) on the surface of the quantum dot QD. For example, only the hydrophilic functional group included in the head portion of the ligand material may remain bonded to the surface of the quantum dot, while most of the ligand material may become bonded with the ligand-removal agent and be removed, and thus the quantum dot may be formed as a surface-modified quantum dot. In the surface-modified quantum dot, the tail portion of the ligand, which is an organic material, is removed and only the hydrophilic functional group remains bonded to the surface of the quantum dot, and thus when the surface-modified quantum dot is used in a light emitting element, the charge injection interference that may otherwise be caused by the ligand may be reduced. For example, the light emitting element including the surface-modified quantum dot may have improved charge transfer properties.

In some embodiments, the ligand residues RS (FIG. 5) generated from the reaction between the ligand LD and the ligand-removal agent RM may be removed after the act of providing of heat to form an emission layer (S200). For example, after the act of providing of heat to form an emission layer (S200), the act of cleaning ligand residues (S300) may be performed. The ligand residues RS (FIG. 5) generated from the reaction between the ligand LD and the ligand-removal agent RM can mostly be removed in the cleaning, but some ligand residues RS may remain in the emission layer EL (FIG. 5).

Figure 13A:
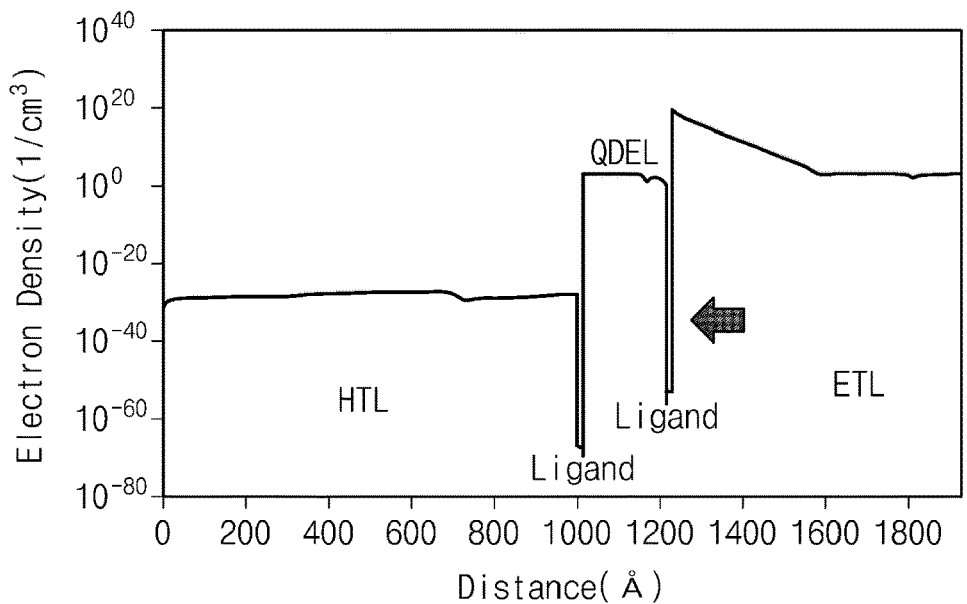
FIGS. 13A and 13B are graphs showing results of electron density simulation for each layer of light emitting elements of Examples and Comparative Examples.
Figure 13B:
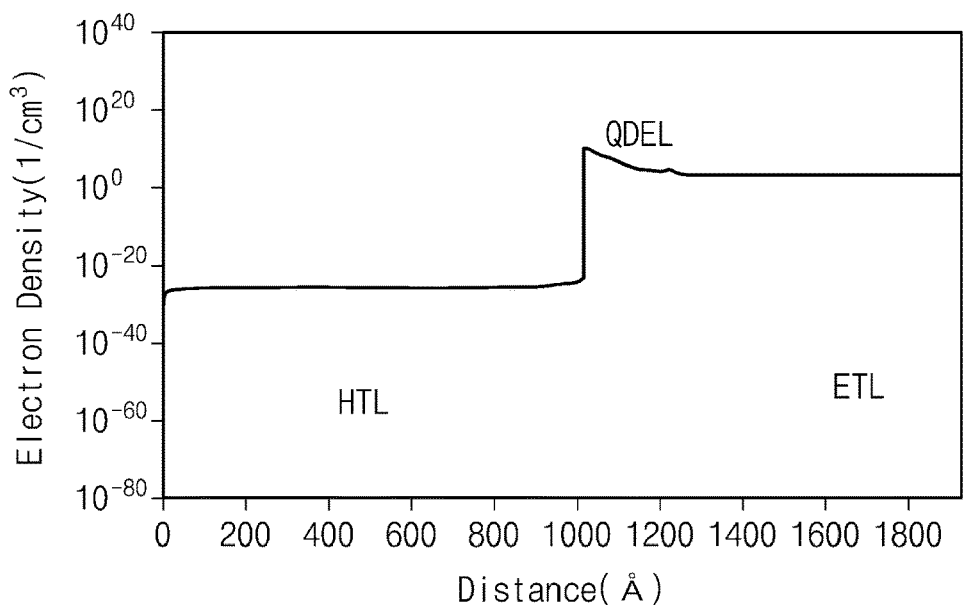

FIGS. 13A and 13B are graphs showing simulation results of electron density for each layer of light emitting elements of Examples and Comparative Examples. In FIG. 13A, which illustrates results for a light emitting element of Comparative Examples, a 1-Dodecanethiol ligand is bonded to a surface of a quantum dot, and the light emitting element does not undergo a separate ligand-removal reaction. In FIG. 13B, which illustrates results for a light emitting element of Examples, the light emitting element undergoes the ligand-removal reaction according to the present embodiments. In FIGS. 13A and 13B, simulation results of forming a monolayer of a quantum dot emission layer are shown.

Referring to FIGS. 13A and 13B for comparison, it is seen that in the light emitting element of Comparative Examples, the ligand bonded to the surface of the quantum dot generates a region in which electron density rapidly decreases before and after a quantum dot emission layer QDEL. In the light emitting element of an embodiment, in which the ligand including the metal connecting portion is removed through a ligand-removal reaction, and only a hydrophilic functional group remains on the surface of the quantum dot, a region in which electron density rapidly decreases before and after the quantum dot emission layer QDEL is not generated, and the electron density remains relatively high. Accordingly, it is confirmed that the light emitting element of the present embodiments exhibits improved element properties when including, in the emission layer, a surface-modified quantum dot in which the connecting and tail portions of the ligand bonded to the surface of the quantum dot are effectively removed by a ligand-removal agent.

Figure 14:
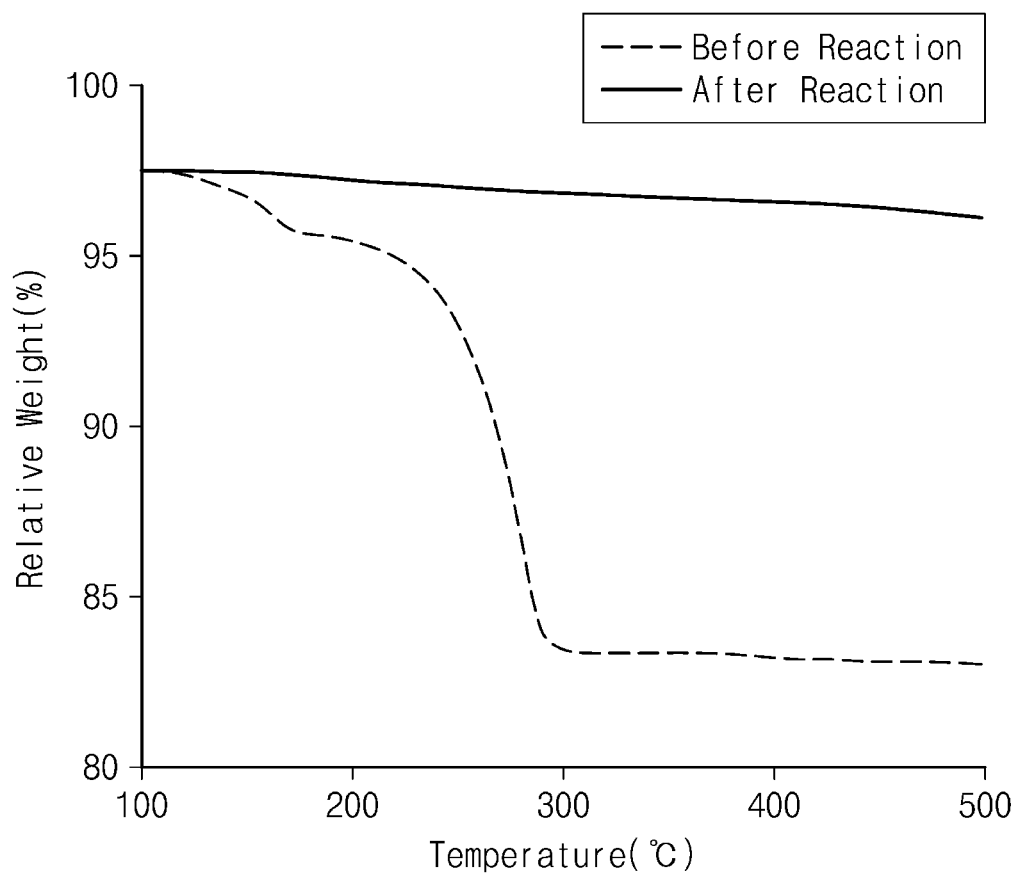
FIG. 14 is a graph showing results of thermal analysis for a quantum dot composition before and after reaction.
Figure 15:
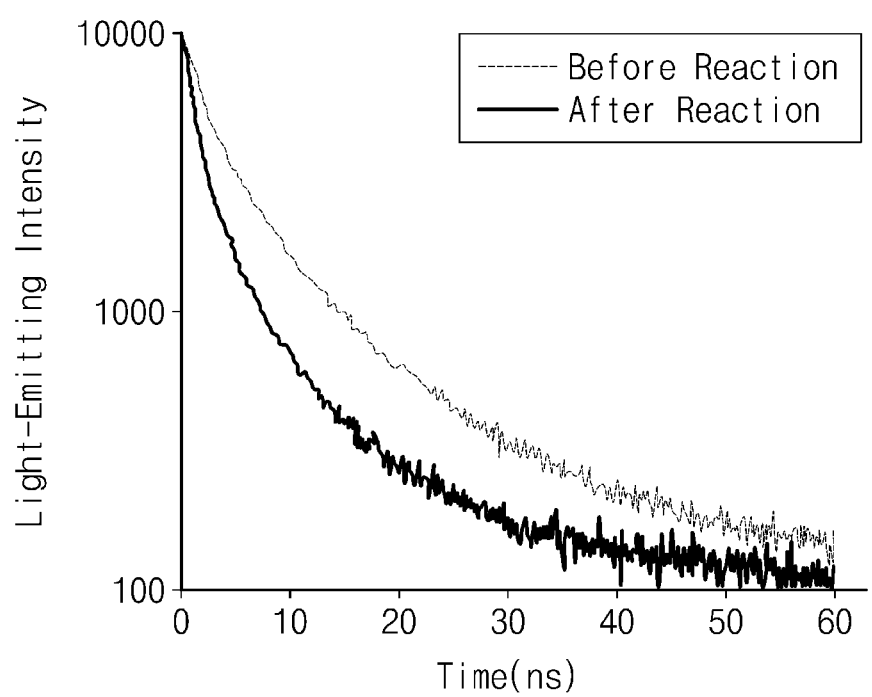
FIG. 15 is a graph showing results of electron transition time analysis of a quantum dot composition before and after reaction.

FIG. 14 shows thermal analysis results of a quantum dot composition before and after the reaction between a ligand material and a ligand-removal agent in the quantum dot composition of the embodiments. The thermal analysis results of the quantum dot composition were obtained by measuring relative changes in sample weight measured using thermogravimetric analysis (TGA). FIG. 15 shows electron transition time analysis results of the quantum dot composition before and after the reaction between the ligand material and the ligand-removal agent in the quantum dot composition of the embodiments. The electronic transition time analysis results were obtained by measuring changes in PL intensity according to change in time using Time-Resolved Photoluminescence.

Referring to FIG. 14, it can be seen from the "Before Reaction" graph that the relative weight (%) was significantly reduced at about 250° C. or higher. Without being bound by any particular theory, this suggests that the elimination of the connecting portion and the tail portion of the ligand has contributed to the results. For example, in the quantum dot "before reaction", the ligand including the head portion, the connecting portion, and the tail portion is bonded to the surface of the quantum dot, and such ligand is dissolved at a high temperature to have a significantly reduced weight at about 250° C. or higher. In comparison, the "After Reaction" graph shows a relatively little decrease in weight even at about 300° C. or higher, which suggests that most of the connecting portion and tail portion of the ligand were already removed due to the radical reaction. For example, it can be confirmed that for the quantum dot composition of the present embodiments, a modified quantum dot may be provided by removing the connecting portion and tail portion of the ligand bonded to the surface of the quantum dot through the ligand-removal reaction.

Referring to FIG. 15, it can be seen that the "Before Reaction" graph shows higher intensity over the entire time than the "After Reaction" graph. Without being bound by any particular theory, this indicates the quantum dot "Before Reaction" (pre-reaction quantum dot) has a longer electron transition time than the quantum dot "After Reaction" (post-reaction quantum dot). The quantum dot of the present embodiments, that is, the quantum dot "After Reaction," is relatively closer to adjacent or other quantum dots compared to the quantum dot "Before Reaction", and thus the electron transition time is shortened, thereby providing a quantum dot emission layer having improved luminous efficiency and element life. For example, it can be confirmed that for the quantum dot composition of the embodiments, a modified quantum dot having improved element efficiency and service life may be provided by removing the connecting portion and tail portion of the ligand bonded to the surface of the quantum dot through the ligand-removal reaction.

Figure 16:
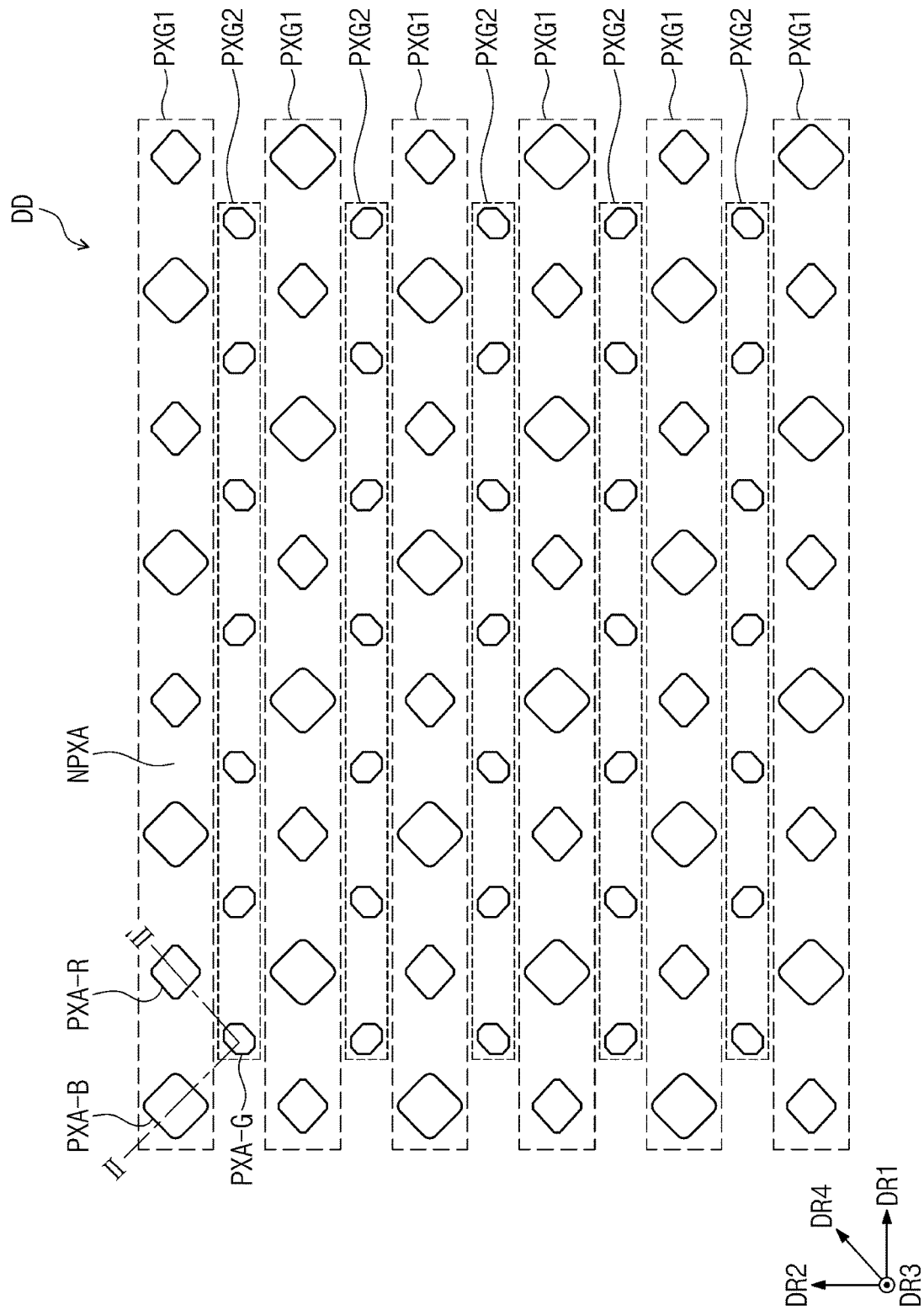
FIG. 16 is a plan view showing a display device according to an embodiment.

FIG. 16 is a plan view of a display device DD according to an embodiment. FIG. 17 is a cross-sectional view of a display device DD according to an embodiment. FIG. 17 is a cross-sectional view corresponding to a line II-II' of FIG. 16.

Referring to FIGS. 16 and 17, the display device DD of some embodiments may include a plurality of light emitting elements ED-1, ED-2, and ED-3, and the light emitting elements ED-1, ED-2, and ED-3 may respectively include emission layers EL-B, EL-G, and EL-R respectively having surface-modified quantum dots MQD1, MQD2, and MQD3.

In some embodiments, the display device DD of some embodiments may include a display panel DP containing the plurality of light emitting elements ED-1, ED-2 and ED-3, and a light control layer PP on the display panel DP. In some embodiments, the light control layer PP may be omitted from the display device DD of an embodiment.

The display panel DP may include a base substrate BS, a circuit layer DP-CL, and a display element layer DP-EL provided on the base substrate BS, and the display element layer DP-EL may include a pixel defining layer PDL, light emitting elements ED-1, ED-2 and ED-3 between portions (e.g., inner wall surfaces) of the pixel defining layer PDL, and an encapsulation layer TFE on the light emitting elements ED-1, ED-2 and ED-3.

The display device DD may include a non-light emission area NPXA and light emission areas PXA-B, PXA-G and PXA-R. Each of the light emission areas PXA-B, PXA-G and PXA-R may be an area capable of emitting light generated from the respective light emitting elements ED-1, ED-2 and ED-3. The light emission areas PXA-B, PXA-G and PXA-R may be spaced apart from one another on a plane.

The light emission areas PXA-B, PXA-G and PXA-R may be divided into a plurality of groups according to the color of light generated from the light emitting elements ED-1, ED-2 and ED-3. In the display device DD of the embodiments illustrated in FIGS. 16 and 17, three light emission areas PXA-B, PXA-G and PXA-R to emit blue light, green light, and red light respectively are exemplarily illustrated. For example, the display device DD of some embodiments may include a blue light emission area PXA-B, a green light emission area PXA-G and a red light emission area PXA-R, which are separated from one another.

The plurality of light emitting elements ED-1, ED-2 and ED-3 may emit light in different wavelength regions. For example, in some embodiments, the display device DD may include a first light emitting element ED-1 to emit blue light, a second light emitting element ED-2 to emit green light, and a third light emitting element ED-3 to emit red light. However, embodiments of the present disclosure are not limited thereto, and the first to third light emitting elements ED-1, ED-2 and ED-3 may emit light in the same wavelength region or emit light in at least one different wavelength region.

For example, the blue light emission area PXA-B, the green light emission area PXA-G, and the red light emission area PXA-R of the display device DD may correspond to the first light emitting element ED-1, the second light emitting element ED-2, and the third light emitting element ED-3, respectively.

The second emission layer EL-G of the second light emitting element ED-2, and the third emission layer EL-R of the third light emitting element ED-3 may include a second surface-modified quantum dot MQD2 and a third surface-modified quantum dot MQD3, respectively. The second surface-modified quantum dot MQD2 and the third surface-modified quantum dot MQD3 may emit green light, which is a second light, and red light, which is a third light, respectively.

Each of the first to third surface-modified quantum dots MQD1, MQD2, and MQD3 may have a quantum dot and a hydrophilic group bonded to a surface of the quantum dot. For each of the first to third surface-modified quantum dots MQD1, MQD2, and MQD3, the description of the surface-modified quantum dot MQD in the light emitting element of the present embodiments described above may be equally applied.

Each of the first to third emission layers EL-B, EL-G, and EL-R respectively including the first to third surface-modified quantum dots MQD1, MQD2, and MQD3 may be derived from a quantum dot composition including a ligand bonded to a surface of a quantum dot. For example, the first to third emission layers EL-B, EL-G, and EL-R may respectively include first to third surface-modified quantum dots MQD1, MQD2, and MQD3 formed when a part of the ligand including a head portion bonded to the quantum dot surface, a connecting portion containing a metal, and a tail portion coordinated to the metal is dissociated.

In some embodiments, each of the first to third emission layers EL-B, EL-G, and EL-R may further include residues derived from the reaction between the ligand and the ligand-removal agent. The reaction residues may include a metal included in the connecting portion of the ligand, an organic ligand included in the tail portion, and a substituent included in the ligand-removal agent.

In some embodiments, the first to third surface-modified quantum dots MQD1, MQD2, and MQD3 included in the light emitting elements ED-1, ED-2, and ED-3 may be formed of different core materials. In some embodiments, the first to third surface-modified quantum dots MQD1, MQD2, and MQD3 may be formed of the same core material, or two quantum dots selected from the first to third surface-modified quantum dots MQD1, MQD2, and MQD3 may be formed of the same core material, and the rest may be formed of different core materials.

In some embodiments, the first to third surface-modified quantum dots MQD1, MQD2, and MQD3 may have different diameters. For example, the first surface-modified quantum dot MQD1 used in the first light emitting element ED-1 to emit light in a relatively short wavelength range may have a relatively smaller average diameter than the second surface-modified quantum dot MQD2 of the second light emitting element ED-2 and the third surface-modified quantum dot MQD3 of the third light emitting element ED-3, each intended to emit light in a relatively long wavelength region. In the present description, the average diameter refers to the arithmetic mean of the diameters of a plurality of quantum dot particles. The diameter of the quantum dot particle may be the average value of the width of the quantum dot particle in a cross section.

In the display device DD of the embodiments, as shown in FIGS. 16 and 17, the areas of the light emission areas PXA-B, PXA-G and PXA-R may be different from one another. In this case, the area may refer to an area when viewed on a plane defined by the first direction DR1 and the second direction DR2.

The light emission areas PXA-B, PXA-G and PXA-R may have different areas according to the color emitted from the emission layers EL-B, EL-G and EL-R of the light emitting elements ED-1, ED-2 and ED-3. For example, referring to FIGS. 16 and 17, the blue light emission area PXA-B corresponding to the first light emitting element ED-1 to emit blue light may have the largest area, and the green light emission area PXA-G corresponding to the second light emitting element ED-2 to emit green light may have the smallest area in the display device DD. However, the embodiments of the present disclosure are not limited thereto, and the light emission areas PXA-B, PXA-G and PXA-R may emit light other than blue light, green light and red light, or the light emission areas PXA-B, PXA-G and PXA-R may have the same area, or the light emission areas PXA-B, PXA-G, and PXA-R may be provided at different area ratios from those shown in FIG. 16.

Each of the light emission areas PXA-B, PXA-G and PXA-R may be separated by a pixel defining layer PDL. The non-light emission areas NPXA may be areas between neighboring light emission areas PXA-B, PXA-G and PXA-R, and may correspond to the pixel defining layer PDL. In the present description, each of the light emission areas PXA-B, PXA-G and PXA-R may correspond to a pixel. The pixel defining layer PDL may separate the light emitting elements ED-1, ED-2 and ED-3. The emission layers EL-B, EL-G and EL-R of the light emitting elements ED-1, ED-2 and ED-3 may be positioned in an opening OH defined by the pixel defining layer PDL, and may be separated from each other.

The pixel defining layer PDL may be formed of a polymer resin. For example, the pixel defining layer PDL may include a polyacrylate-based resin and/or a polyimide-based resin. In some embodiments, the pixel defining layer PDL may further include an inorganic material in addition to the polymer resin. In some embodiments, the pixel defining layer PDL may include a light absorbing material, or may include a black pigment and/or a black dye. The pixel defining layer PDL including a black pigment and/or a black dye may implement (e.g., may be) a black pixel defining layer. When forming the pixel defining layer PDL, carbon black may be used as a black pigment and/or a black dye, but the embodiments of the present disclosure are not limited thereto.

In some embodiments, the pixel defining layer PDL may be formed of an inorganic material. For example, the pixel defining layer PDL may include silicon nitride (SiNx), silicon oxide (SiOx), silicon oxide (SiOxNy), etc. The pixel defining layer PDL may define light emission areas PXA-B, PXA-G, and PXA-R. The light emission areas PXA-B, PXA-G, and PXA-R, and a non-light emission area NPXA may be separated by the pixel defining layer PDL.

Each of the light emitting elements ED-1, ED-2 and ED-3 may include a first electrode EL1, a hole transport region HTR, one of emission layers EL-B, EL-G or EL-R, an electron transport region ETR, and a second electrode EL2. The description in FIG. 4 may be equally applied to the first electrode EL1, the hole transport region HTR, the electron transport region ETR, and the second electrode EL2, except that the first to third surface-modified quantum dots MQD1, MQD2, and MQD3 included in the emission layers EL-B, EL-G, and EL-R are different from one another in the light emitting elements ED-1, ED-2, and ED-3 included in the display device DD.

An encapsulation layer TFE may cover the light emitting elements ED-1, ED-2 and ED-3. The encapsulation layer TFE may be a single layer or a laminated layer of a plurality of layers. The encapsulation layer TFE may be a thin film encapsulation layer. The encapsulation layer TFE may protect the light emitting elements ED-1, ED-2 and ED-3. The encapsulation layer TFE may cover an upper surface of the second electrode EL2 positioned in the opening OH, and may fill the opening OH.

In FIG. 17, the hole transport region HTR and the electron transport region ETR are illustrated as a common layer covering the pixel defining layer PDL, but the embodiments of the present disclosure are not limited thereto. In some embodiments, the hole transport region HTR and the electron transport region ETR may be provided in (e.g., only in) the opening OH defined by the pixel defining layer PDL.

For example, when the hole transport region HTR and the electron transport region ETR, in addition to the emission layers EL-B, EL-G, and EL-R, are provided through an inkjet printing method, the hole transport region HTR, the emission layers EL-B, EL-G, and EL-R, the electron transport region ETR, etc. may be provided corresponding to the defined opening OH between the pixel defining layer PDL. However, the embodiments are not limited thereto, and as shown in FIG. 17, the hole transport region HTR and the electron transport region ETR may cover the pixel defining layer PDL without being patterned, and may be provided as one common layer regardless of a method of providing each functional layer.

In the display device DD illustrated in FIG. 17, although the thicknesses of the emission layers EL-B, EL-G, and EL-R of the first to third light emitting elements ED-1, ED-2, and ED-3 are illustrated to be similar to one another, the embodiments are not limited thereto. For example, in some embodiments, the thicknesses of the emission layers EL-B, EL-G, and EL-R of the first to third light emitting elements ED-1, ED-2, and ED-3 may be different from one another.

Referring to FIG. 16, the blue light emission areas PXA-B and the red light emission areas PXA-R may be alternately arranged in the first direction DR1 to form a first group PXG1. The green light emission areas PXA-G may be arranged in the first direction DR1 to form a second group PXG2.

The first group PXG1 and the second group PXG2 may be spaced apart in the second direction DR2. Each of the first group PXG1 and the second group PXG2 may be provided in plural. The first groups PXG1 and the second groups PXG2 may be alternately arranged in the second direction DR2.

One green light emission area PXA-G may be spaced apart from one blue light emission area PXA-B or one red light emission area PXA-R in the fourth direction DR4. The fourth direction DR4 may be a direction between the first direction DR1 and the second direction DR2.

The arrangement structure of the light emission areas PXA-B, PXA-G and PXA-R shown in FIG. 16 may have a PenTile®/PENTILE® structure or pattern (PENTILE® is a registered trademark owned by Samsung Display Co., Ltd.). However, the arrangement structure of the light emission areas PXA-B, PXA-G and PXA-R in the display device DD according to the present embodiments is not limited to the arrangement structure shown in FIG. 16. For example, in some embodiments, the light emission areas PXA-B, PXA-G and PXA-R may have a stripe structure in which the blue light emission area PXA-B, the green light emission area PXA-G, and the red light emission area PXA-R may be alternately arranged along the first direction DR1.

Referring to FIGS. 3 and 17, the display device DD may further include a light control layer PP. The light control layer PP may block or reduce external light incident to the display panel DP from the outside the display device DD. The light control layer PP may block or reduce a part of external light. The light control layer PP may perform a reflection preventing (or reflection reducing) function minimizing (or reducing) the reflection due to external light.

In an embodiment illustrated in FIG. 17, the light control layer PP may include a color filter layer CFL. For example, the display device DD may further include the color filter layer CFL on the light emitting elements ED-1, ED-2, and ED-3 of the display panel DP.

In the display device DD of some embodiments, the light control layer PP may include a base layer BL and a color filter layer CFL.

The base layer BL may be a member providing a base surface on which the color filter layer CFL is positioned. The base layer BL may be a glass substrate, a metal substrate, a plastic substrate, etc. However, the embodiments of the present disclosure are not limited thereto, and the base layer BL may be an inorganic layer, an organic layer, or a composite material layer (e.g., including an inorganic material and an organic material).

The color filter layer CFL may include a light blocking unit BM and a color filter CF. The color filter may include a plurality of filters CF-B, CF-G, and CF-R. For example, the color filter layer CFL may include a first filter CF-B to transmit a first color light, a second filter CF-G to transmit a second color light, and a third filter CF-R to transmit a third color light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment and/or a dye. The first filter CF-B may include a blue pigment and/or a blue dye, the second filter CF-G may include a green pigment and/or a green dye, and the third filter CF-R may include a red pigment and/or a red dye.

However, the embodiments of the present disclosure are not limited thereto, and the first filter CF-B may omit a pigment and/or a dye. The first filter CF-B may include a polymer photosensitive resin, but not include a pigment or a dye. The first filter CF-B may be transparent. The first filter CF-B may be formed of a transparent photosensitive resin.

The light blocking unit BM may be a black matrix. The light blocking unit BM may include an organic light blocking material and/or an inorganic light blocking material, both including a black pigment and/or a black dye. The light blocking unit BM may prevent or reduce light leakage, and separate boundaries between the adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic material layer including at least one inorganic material selected from silicon nitride, silicon oxide, and silicon oxynitride. The buffer layer BFL may be formed of a single layer or a plurality of layers.

In FIG. 17, the first color filter CF-B of the color filter layer CFL is illustrated to overlap the second filter CF-G and the third filter CF-R, but the embodiments of the present disclosure are not limited thereto. For example, the first to third filters CF-B, CF-G and CF-R may be separated by the light blocking unit BM and may not overlap one another. In some embodiments, each of the first to third filters CF-B, CF-G and CF-R may be provided respectively correspondingly to the blue light emission area PXA-B, green light emission area PXA-G, and red light emission area PXA-R.

In some embodiments, the display device DD may include a polarizing layer as a light control layer PP, instead of the color filter layer CFL. The polarizing layer may block or reduce external light provided to the display panel DP from the outside. The polarizing layer may block or reduce a part of external light.

In some embodiments, the polarizing layer may reduce reflected light generated in the display panel DP by external light. For example, the polarizing layer may function to block or reduce the reflected light in embodiments where light provided from the outside the display device DD is incident to the display panel DP and exits again. The polarizing layer may be a circular polarizer having a reflection preventing function, or the polarizing layer may include a linear polarizer and a λ/4 phase retarder. In some embodiments, the polarizing layer may be provided on the base layer BL to be exposed, or the polarizing layer may be provided under the base layer BL.

The display device of the present embodiments may include, in the emission layer, a surface-modified quantum dot having a modified functional group, in which a part of the ligand is removed to improve charge injection properties that may otherwise be affected by the ligand, so as to exhibit excellent luminous efficiency. For example, the display device of the present embodiments includes an emission layer formed from a quantum dot composition containing a ligand-removal agent, and the resulting emission layer includes a surface-modified quantum dot with a tail portion of the ligand removed using the ligand-removal agent, thereby exhibiting excellent luminous efficiency.

Figure 18:
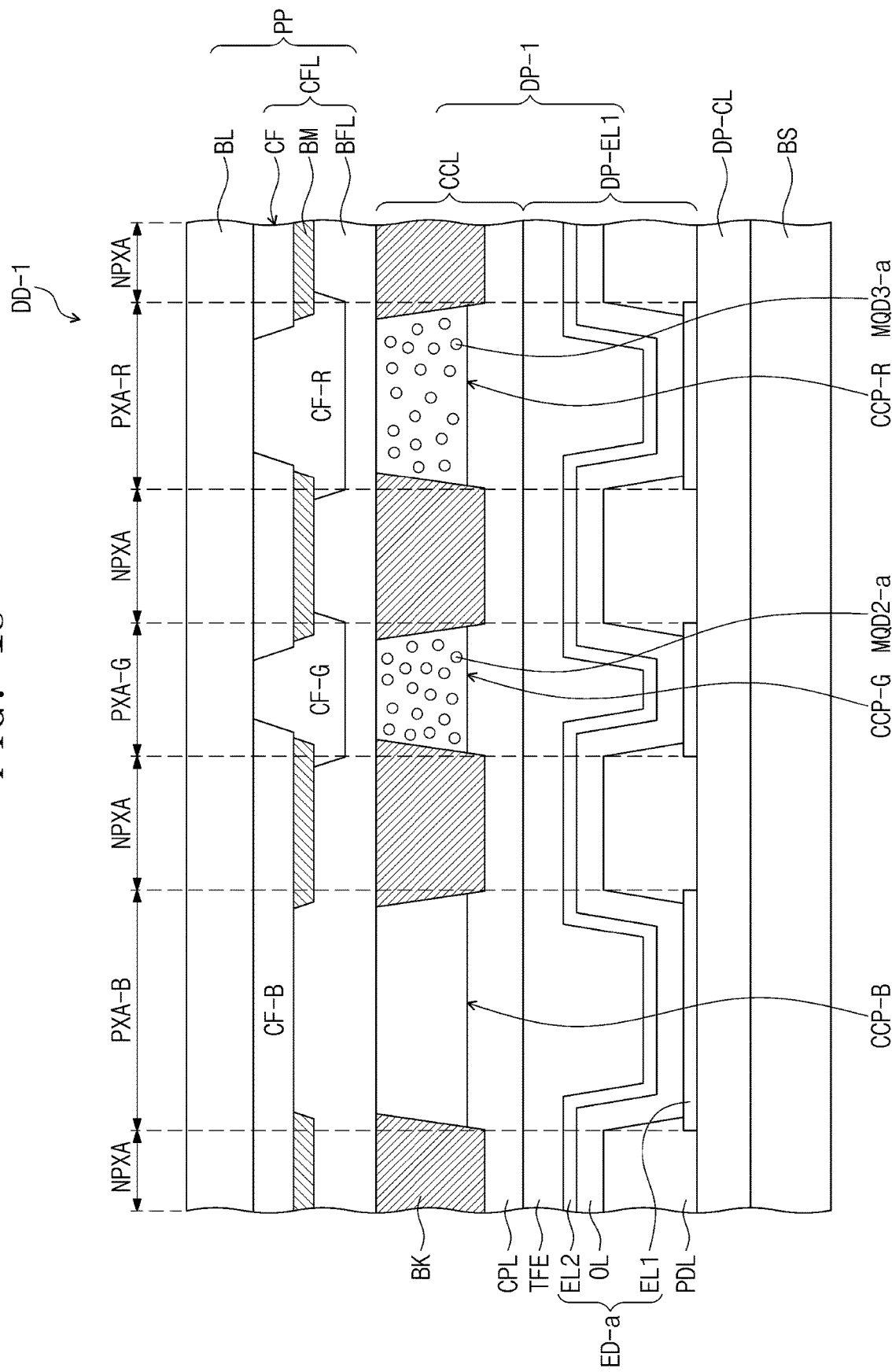

FIG. 18 is a cross-sectional view of a display device DD-1 of other embodiments of the present disclosure. In the description of the display device DD-1 according to the other embodiments, content overlapping with the one described above with reference to FIGS. 1 to 17 will not be described again, and only the differences will be mainly described.

Referring to FIG. 18, the display device DD-1 may include a light control layer CCL on a display panel DP-1. In some embodiments, the display device DD-1 may further include a color filter layer CFL. The color filter layer CFL may be between the base layer BL and the light control layer CCL.

The display panel DP-1 may be a light emitting display panel. For example, the display panel DP-1 may be an organic electroluminescence display panel or a quantum dot light emitting display panel.

The display panel DP-1 may include a base substrate BS, a circuit layer DP-CL provided on the base substrate BS, and a display element layer DP-EL1.

The display element layer DP-EL1 includes a light emitting element ED-a, and the light emitting element ED-a may include a first electrode EL1 and a second electrode EL2 facing each other, and a plurality of layers OL between the first electrode EL1 and the second electrode EL2. The plurality of layers OL may include a hole transport region HTR (FIG. 4), an emission layer EL (FIG. 4), and an electron transport region ETR (FIG. 4). An encapsulation layer TFE may be provided on the light emitting element ED-a.

In the light emitting element ED-a, the same description as the one provided with reference to FIG. 4 may be applied to the first electrode EL1, the hole transport region HTR, the electron transport region ETR, and the second electrode EL2. However, in the light emitting element ED-a included in the display panel DP-1, the emission layer may include a host and a dopant, which are organic electroluminescent materials. or may include the surface-modified quantum dots described with reference to FIGS. 1 to 17. In the display panel DP-1, the light emitting element ED-a may emit blue light.

The light control layer CCL may include a plurality of partition walls BK spaced apart from each other, and light control units CCP-B, CCP-G and CCP-R between the partition walls BK. The partition walls BK may be formed including a polymer resin and a coloring additive. The partition walls BK may be formed including a light absorbing material, or formed including a pigment and/or a dye. For example, the partition walls BK may include a black pigment and/or a black dye to implement a black partition wall. When forming the black partition wall, carbon black and/or the like may be used as a black pigment and/or a black dye, but the embodiments of the present disclosure are not limited thereto.

The light control layer CCL may include a first light control unit CCP-B to transmit a first light, a second light control unit CCP-G including a second surface-modified quantum dot MQD2-a to convert the first light to a second light, and a third light control unit CCP-R including a third surface-modified quantum dot MQD3-a to convert the first light to a third light. The second light may be light of a longer wavelength region than the first light, and the third light may be light of a longer wavelength region than the first light and the second light. For example, the first light may be blue light, the second light may be green light, and the third light may be red light. Regarding the surface-modified quantum dots MQD2-a and MQD3-a included in the light control units CCP-G and CCP-R, the same description as the one provided for the surface-modified quantum dots MQD2 and MQD3 used in the emission layers EL-G and EL-R illustrated in FIG. 17 may be applied.

The light control layer CCL may further include a capping layer CPL. The capping layer CPL may be on the light control units CCP-B, CCP-G and CCP-R, and the partition walls BK. The capping layer CPL may serve to prevent or reduce penetration of moisture and/or oxygen (hereinafter, referred to as "moisture/oxygen"). The capping layer may be provided on the light control units CCP-B, CCP-G and CCP-R to prevent or reduce the light control units CCP-B, CCP-G and CCP-R from being exposed to moisture/oxygen. The capping layer CPL may include at least one inorganic layer.

The display device DD-1 may include a color filter layer CFL on the light control layer CCL, and the descriptions provided with respect to FIG. 17 may be equally applied to the color filter layer CFL and the base layer BL of the display device DD-1.

The display device DD-1 may exhibit excellent color reproducibility by including, in the light control layer CCL, the surface-modified quantum dots MQD2-a and MQD3-a, in which a functional group having a part of a ligand removed is bonded to the surfaces thereof.

In some embodiments, in the display device DD-1, the light emitting element ED-a of the display panel DP-1 may include an emission layer containing a surface-modified quantum dot in which a part of a ligand is removed, and in this case, the display panel DP-1 may exhibit excellent luminous efficiency.

A quantum dot composition of an embodiment may be used as an emission layer material capable of exhibiting improved luminous efficiency, and may include a ligand having a metal connecting portion that may be easily (or suitably) removed by a ligand-removal reaction and a tail portion bonded thereto.

A light emitting element of the present embodiments may exhibit improved luminous efficiency and element service life, and may include a surface-modified quantum dot material having a modified surface property in an emission layer.

Although the present disclosure has been described with reference to example embodiments of the present disclosure, it will be understood that the present disclosure should not be limited to these example embodiments, but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. A quantum dot composition comprising:
   a quantum dot; and
   a ligand bonded to a surface of the quantum dot,
   wherein the ligand comprises:
      a head portion bonded to the surface of the quantum dot;
      a connecting portion connected to the head portion and comprising a metal; and
      a tail portion coordinated to the metal of the connecting portion.

2. The quantum dot composition of claim 1, wherein the head portion comprises at least one selected from a thiol group and a hydroxyl group.

3. The quantum dot composition of claim 1, wherein the quantum dot comprises a core and a shell around the core.

4. The quantum dot composition of claim 1, further comprising a ligand-removal agent to react with the connecting portion.

5. The quantum dot composition of claim 1, wherein the connecting portion comprises at least one selected from Cd, Zn, In, Sn, Sb, Ga, Ge, As, Hg, Ni, Pd, Pt, Co, Rh, Ir, Fe, Ru, Os, Mn, Mo, and Cr.

6. The quantum dot composition of claim 1, wherein the tail portion comprises at least one selected from (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide connecting atom selected from S, Se, and Te, an oxygen atom, and a nitrogen atom, and
   R is an alkyl group having 1 to 20 carbon atoms.

7. The quantum dot composition of claim 1, wherein the ligand is a monodentate ligand or a bidentate ligand.

8. The quantum dot composition of claim 1, wherein the ligand is represented by Formula 1:

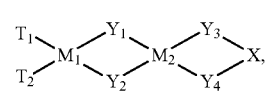

Formula 1 and
   wherein in Formula 1,
   $T_1$ and $T_2$ are each independently a thiol group or a hydroxyl group,
   $M_1$ and $M_2$ are each independently at least one selected from Cd, Zn, In, Sn, Sb, Ga, Ge, As, Hg, Ni, Pd, Pt, Co, Rh, Ir, Fe, Ru, Os, Mn, Mo, and Cr,
   $Y_1$ to $Y_4$ are each independently O or S, and
   X is a substituted or unsubstituted amine group, a substituted or unsubstituted oxy group, a substituted or unsubstituted thio group, a substituted or unsubstituted ester group, a substituted or unsubstituted amide group, or a substituted or unsubstituted alkyl group having 1 to 20 carbon atoms.

9. The quantum dot composition of claim 1, further comprising an organic solvent.

10. A light emitting element comprising:
    a first electrode;
    a hole transport region on the first electrode;
    an emission layer on the hole transport region, the emission layer comprising a quantum dot comprising a hydrophilic group;

an electron transport region on the emission layer; and a second electrode on the electron transport region.

11. The light emitting element of claim 10, wherein the emission layer further comprises ligand residues comprising a metal and an organic ligand.

12. The light emitting element of claim 11, wherein the ligand residues comprise at least one selected from Cd, Zn, In, Sn, Sb, Ga, Ge, As, Hg, Ni, Pd, Pt, Co, Rh, Ir, Fe, Ru, Os, Mn, Mo, and Cr.

13. The light emitting element of claim 11, wherein the ligand residues comprise at least one selected from (—O(O)—CNR), (—S(S)—CNR), (—O(O)—COR), (—S(S)—COR), (—O(O)—CR), (—S(S)—CR), a pyridine group, a bipyridine group, a quinoline group, a quinolinol group, a chalcogenide connecting atom selected from S, Se, and Te, an oxygen atom, and a nitrogen atom, and R is an alkyl group having 1 to 20 carbon atoms.

14. The light emitting element of claim 11, wherein at least a part of the organic ligand is coordinated to the metal.

15. The light emitting element of claim 10, wherein the quantum dot comprises a core and a shell around the core, and the hydrophilic group is bonded to a surface of the quantum dot.

16. The light emitting element of claim 10, wherein the hydrophilic group comprises at least one selected from a thiol group and a hydroxyl group.

17. A method for manufacturing a light emitting element, the method comprising:

forming a first electrode;

forming a hole transport region on the first electrode;

forming an emission layer, the forming of the emission layer comprising providing, on the hole transport region, a quantum dot composition comprising a quantum dot composite comprising a quantum dot and a ligand bonded to a surface of the quantum dot;

forming an electron transport region on the emission layer; and forming a second electrode on the electron transport region, wherein the ligand comprises:

a head portion bonded to the surface of the quantum dot;

a connecting portion connected to the head portion and comprising a metal; and a tail portion coordinated to the metal of the connecting portion.

18. The method of claim 17, wherein the forming of the emission layer comprises:

providing the quantum dot composition to form a preliminary emission layer; and applying heat or light to the preliminary emission layer to dissociate at least a part of the ligand bonded to the quantum dot.

19. The method of claim 18, wherein the emission layer comprises a hydrophilic group-containing quantum dot, in which a remaining part of the ligand, except for the at least a part of the ligand dissociated from the quantum dot, is bonded to the surface of the quantum dot.

20. The method of claim 17, wherein the connecting portion comprises at least one selected from Cd, Zn, In, Sn, Sb, Ga, Ge, As, Hg, Ni, Pd, Pt, Co, Rh, Ir, Fe, Ru, Os, Mn, Mo, and Cr.

* * * * *